United States Patent
Hasebe et al.

(10) Patent No.: US 7,235,413 B2
(45) Date of Patent: Jun. 26, 2007

(54) FABRICATION METHOD OF SEMICONDUCTOR INTEGRATED CIRCUIT DEVICE

(75) Inventors: Akio Hasebe, Kodaira (JP); Yasunori Narizuka, Hiratsuka (JP); Yasuhiro Motoyama, Hachioji (JP); Teruo Shoji, Mitaka (JP)

(73) Assignee: Renesas Technology Corp., Tokyo (JP)

( * ) Notice: Subject to any disclaimer, the term of this patent is extended or adjusted under 35 U.S.C. 154(b) by 269 days.

(21) Appl. No.: 10/968,431

(22) Filed: Oct. 20, 2004

(65) Prior Publication Data

US 2005/0095734 A1    May 5, 2005

(30) Foreign Application Priority Data

Oct. 31, 2003    (JP)    ............................. 2003-372323

(51) Int. Cl.
 H01L 21/66    (2006.01)
 G01R 31/26    (2006.01)
(52) U.S. Cl. ............................. 438/15; 438/14; 438/17; 324/754; 324/758
(58) Field of Classification Search ................. 438/17, 438/15; 324/754
 See application file for complete search history.

(56) References Cited

U.S. PATENT DOCUMENTS 7,049,837 B2 *    5/2006    Kasukabe et al. ........... 324/754

2002/0008529 A1    1/2002    Wilson et al.
2004/0070413 A1*    4/2004    Kasukabe et al. .......... 324/754

FOREIGN PATENT DOCUMENTS

| JP | 7-283280 | 10/1995 |
| JP | 8-50146 | 2/1996 |
| JP | 10-239348 | 9/1998 |
| JP | 2002-71719 | 3/2002 |
| JP | 2002-71720 | 3/2002 |
| JP | 2002-90387 | 3/2002 |

OTHER PUBLICATIONS

JP 2002090387 A, Wilson et al., English Abstract.*

* cited by examiner

*Primary Examiner*—Andy Nuynh
*Assistant Examiner*—Earl Taylor
(74) *Attorney, Agent, or Firm*—Antonelli, Terry, Stout & Kraus, LLP.

(57) ABSTRACT

Any damage inflicted on test pads, inter-layer insulating films, semiconductor elements or wiring at the time of electrical inspection of semiconductor integrated circuit devices is to be reduced. Reinforcements having a substantially equal linear expansion ratio (coefficient of thermal expansion) relative to a wafer to be inspected are formed over an upper face of a thin film probe, grooves are cut in the reinforcements above the probes, a first elastomer which is softer than a second elastomer is so arranged as to fill the grooves and overflow the grooves by a prescribed quantity, a glass epoxy substrate, which is a multi-layered wiring board, is fitted over the second elastomer, and pads provided over an upper face of the glass epoxy substrate and bonding pads which are part of wirings belonging to the thin film probe are electrically connected by wires.

17 Claims, 34 Drawing Sheets

FABRICATION METHOD OF SEMICONDUCTOR INTEGRATED CIRCUIT DEVICE

CROSS-REFERENCE TO RELATED APPLICATION

The present application claims priority from Japanese patent application No. 2003-372323, filed on Oct. 31, 2003, the content of which is hereby incorporated by reference into this application.

BACKGROUND OF THE INVENTION

The present invention relates to a technique for use in the fabrication of semiconductor integrated circuit devices, and, more particularly, to a technique that can be effectively applied to electrical inspection of semiconductor integrated circuits in a semiconductor wafer state.

For instance, there is a known technique for use in forming contact terminals, lead-out wiring and the like of an inspection apparatus for use in probing semiconductor integrated circuits in a wafer state (see Patent Reference 1 and Patent Reference 2, for example). By this method, a mold for shaping contact terminals is prepared by anisotropic etching of a silicon wafer, for example, and contact terminals, lead-out wiring and the like are formed by use of this mold, followed by removal of the silicon wafer, which has served as the mold, after the formation of the contact terminals, the lead-out wiring and the like is completed.

By another known method, electroconductive particulates are sprayed over a plurality of positions of lead-out wiring formed over an insulating film to create sharp-tipped stubs, which constitute contact terminals; the insulating film provided with these contact terminals is cased to adhered to a substrate, and the substrate is fixed to a wiring board to form a connecting device, which is then probed under a light load to obtain an inspection apparatus (see Patent Reference 3, for example).

There is another known technique in which a probe card is configured of a base material part, a wiring part and extended wiring. The wiring part, shaped as a cantilever beam, is provided with a fixing portion for fixing the wiring part to a substrate. A an intermediate portion stands out from that fixing portion, and a protrusive supporting portion, following that intermediate portion, supports probes, and the probes are placed in contact with electrodes of a semiconductor element to be inspected. This configuration gives a sufficient stroke and scribing function to the probes (see Patent Reference 4, for example).

Yet another known technique uses micromachining technology to fabricate, simply and with a high yield, connecting apparatuses that excel in height accuracy and spacing accuracy of tips and in wear-resistance and reliability thereof against frequent contact with electrodes, and, accordingly, which are capable of maintaining a satisfactory contact performance for a long period of time. A silicon dioxide film serving as a sacrificial layer is formed over a sacrificial substrate consisting of silicon, a tip structure consisting of contacts and lead-out wiring is formed over this sacrificial layer, and the sacrificial substrate is efficiently separated from the tip structure by dissolving the sacrificial layer (see Patent Reference 5, for example).

Yet another known technique provides a probe contact apparatus having low-inductance high-density contacts that can be configured for use in inspecting area array integrated circuits and which is provided with high-speed means for fabrication, alteration or repair (see Patent Reference 6, for example). This apparatus has a rigid substrate which has thermal expansion characteristics close to silicon and over which laser-patterned lead wires and flexible films having lead wires and contact pads are stacked. Precious metal contact elements protrude from the two main surfaces of the rigid substrate. The contact elements on the first surface are arranged in a mirror relationship with chip pads that are densely separated from one another, and those on the second surface are coordinated with more sparsely separated probe card pads.

[Patent Reference 1] Japanese Unexamined Patent Publication No. Hei 7(1995)-283280

[Patent Reference 2] Japanese Unexamined Patent Publication No. Hei 8(1996)-50146

[Patent Reference 3] Japanese Unexamined Patent Publication No. Hei 10(1998)-239348

[Patent Reference 4] Japanese Unexamined Patent Publication No. 2002-71719

[Patent Reference 5] Japanese Unexamined Patent Publication No. 2002-71720

[Patent Reference 6] Japanese Unexamined Patent Publication No. 2002-90387

SUMMARY OF THE INVENTION

Available inspection methods for semiconductor integrated circuit devices include, for instance, probing. Probing involves functional tests to check whether or not the devices perform their functions as prescribed and tests on DC operation characteristics and AC operation characteristics to distinguish between satisfactory and rejectable products.

In recent years, probing of semiconductor integrated circuit devices has involved the use of techniques applicable to a semiconductor wafer (hereinafter to be simply referred to as a wafer) state to meet requirements for compatibility with shipment in a wafer form (for qualitative differentiation), compatibility with a Known Good Die (KGD) (for raising the yield of multi-chip package (MCP)) and reductions in total cost.

Along with the capacity expansion of memory products, which constitute a kind of semiconductor integrated circuit device, and an increase in logic products with built-in memories, which make up another kind of semiconductor integrated circuit device, the length of time required to probe such products in a wafer state is increasing. For this reason, it is required to enhance the throughput of probing devices in a wafer state. In order to enhance the throughput of probing, it is necessary to shorten the probing time spent per wafer. The probing time $T0$ spent per wafer can be represented by, for instance, $T0=(T1+T2)\times N+T3$, where $T1$ is the time taken by the probing device per test, $T2$ in the index time taken by the prober, $N$ is the number of times the prober's probes are brought into contact with the wafer (hereinafter referred to as the number of touch-downs), and $T3$ is the time taken to replace a wafer with another wafer. This equation reveals that enhancing the throughput of probing devices in a wafer state can be achieved by reducing the number of touch-downs.

Also, with a view to reducing the cost of fabricating semiconductor integrated circuit devices, attempts are being made to curtail the area of each semiconductor chip (hereinafter referred to as simply as a chip) by minimizing the dimensions of the semiconductor element and wiring and thereby to increase the number of chips acquired per wafer. In this connection, the pitch of a test pad (bonding pad) arrangement is shortened, and the area of each test pad is decreased. Now, where inspection is to be carried out using a prober having cantilevered probes, the probes are wiped over the surface of the test pads to break the natural oxide film formed over the surface of the test pads and thereby to bring the probes into contact with the test pads. The wiping of the probes not only breaks the natural oxide film over the surface of the test pads, but also damages the surface of the test pads themselves. Since the test pads are now reduced in area, as mentioned above, the proportion of the damage to the whole surface of the test pads is greater. This results in a problem in that the adhesion of the bonding wires connected to those test pads becomes weaker in the rest of the fabrication process.

On the other hand, an inter-layer insulating film of a low dielectric constant is sometimes used in the process of forming a semiconductor element and wiring. Since an insulating film having a low dielectric constant is weaker in mechanical strength, there is another problem in that, when the probes come into contact with the test pads at the time of probing, the impact due to that contact may crack or otherwise damage the pads.

There is still another problem. To reduce the chip size, the test pads may be disposed above an active element or wiring that is electrically connected to that active element. If in a probing process the probes come into contact with such test pads, the impact of the contact may destroy the active element and wiring underneath.

An object of the present invention is to provide a technique that can help enhance the throughput of electrical inspection of semiconductor integrated circuits in a wafer state.

Another object of the invention is to provide a technique that can help reduce damage to test pads, inter-layer insulating films, semiconductor elements and wiring in the electrical inspection of semiconductor integrated circuit devices.

The above-described and other objects and novel features of the present invention will become apparent from the following description in this specification, when taken in conjunction with the accompanying drawings.

Typical aspects of the invention disclosed in the present application will be briefly described below.

A fabrication method of semiconductor integrated circuit devices according to the invention comprises the steps of:

(a) preparing a semiconductor wafer which is partitioned into a plurality of chip areas, a semiconductor integrated circuit being formed in each of the plurality of chip areas, and over whose main face a plurality of first electrodes electrically connected to the semiconductor integrated circuits are formed;

(b) preparing a first card which holds a first sheet having a wiring electrically connected to a plurality of contact terminals for establishing contact with the plurality of first electrodes and the plurality of contact terminals in such a way that the tips of the plurality of contact terminals protrude toward the main face of the semiconductor wafer; and (c) electrically inspecting the semiconductor integrated circuits by bringing the plurality of contact terminals into contact with the plurality of first electrodes, wherein the tips of the plurality of contact terminals are arranged over a first face of the first sheet, and a plurality of second electrodes formed from part of the wiring are arranged over a second face of the first sheet, opposite to the first face, wherein the first card has a first substrate electrically connected to the plurality of second electrodes and suppressing mechanisms for suppressing the plurality of contact terminals toward the plurality of first electrodes, wherein the first substrate has a first circuit and over its main face a plurality of third electrodes electrically connected to the first circuit are formed, wherein the plurality of third electrodes are electrically connected to respectively matching ones of the plurality of second electrodes via first wires, wherein the suppressing mechanisms are arranged above the plurality of contact terminals over the second face of the first sheet, and wherein one of the suppressing mechanisms suppresses one or more of the contact terminals.

Advantages achieved by some of the most typical aspects of the invention disclosed in the present application will be briefly described below.

In the electrical inspection of semiconductor integrated circuit devices, damage to test pads, inter-layer insulating films, semiconductor elements and wiring can be reduced.

Figure 1:
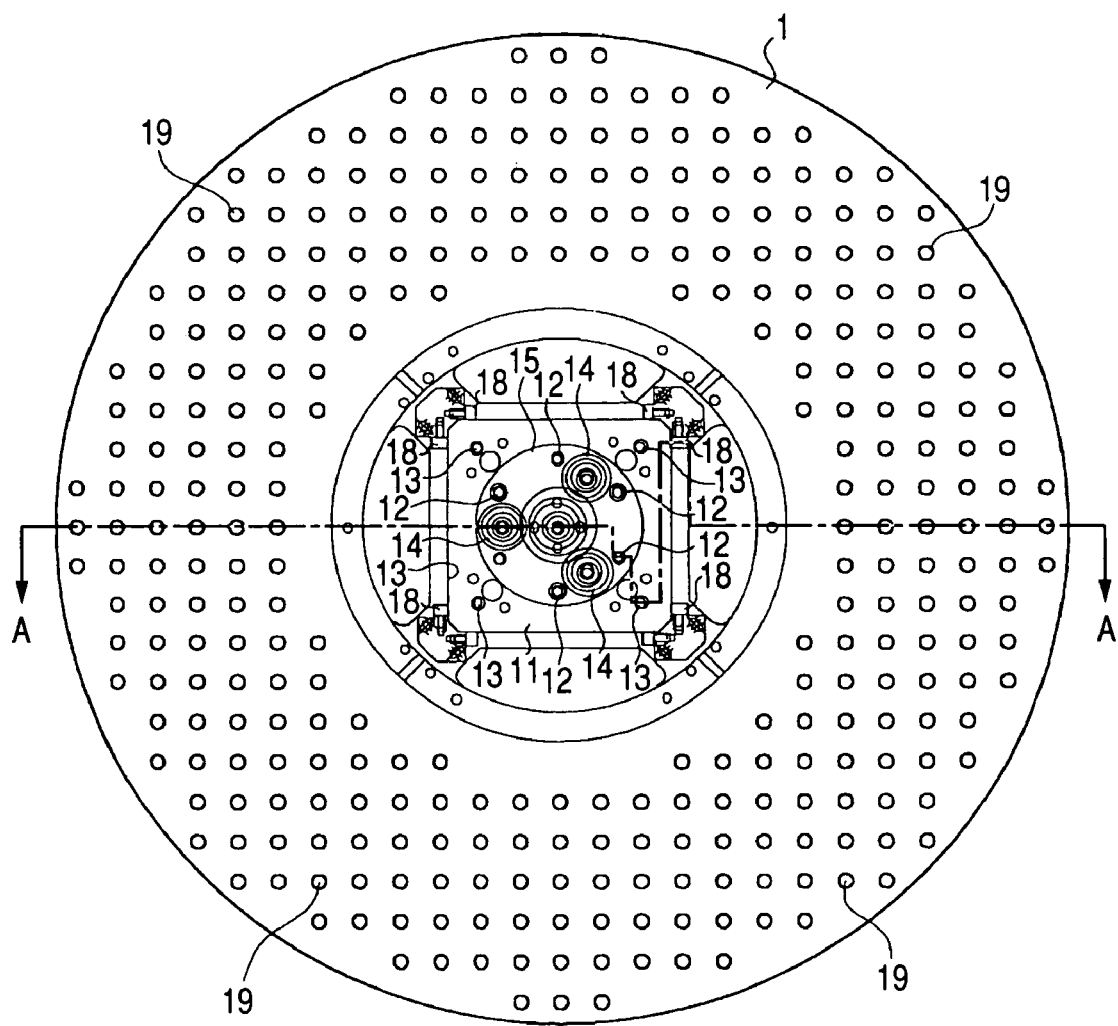
FIG. 1 is a plan view of a probe card, which represents Embodiment 1 of the present invention.

DESCRIPTION OF THE PREFERRED
EMBODIMENTS OF THE INVENTION

Before describing the present invention in detail, the terminology used in the following description will be explained below.

A wafer is any of a single crystal silicon substrate (usually shaped in a substantially flat circle), a silicon on insulator (SOI) substrate, a sapphire substrate, a glass substrate, any other insulating, non-insulating or semiconductor substrate and a substrate combining more than one of these, used in the fabrication of integrated circuits. When a semiconductor integrated circuit device is referred to in this application, the term covers not only what is fabricated over a semiconductor or insulator substrate, such as a silicon wafer, a sapphire substrate or the like, but also, unless otherwise stated expressly, what is fabricated over any other insulating substrate, such as a thin film transistor (TFT), a super-twisted-nematic (STN) liquid crystal, glass or the like.

A device face means the main face of a wafer, over which a device pattern matching a plurality of chip areas is formed by lithography.

A contact mechanism is an integrated structure of a wiring layer and a tipped-contact terminal connected to it, formed by a similar wafer process for using silicon wafers for the fabrication of semiconductor integrated circuits, namely a patterning technique combining photolithography, chemical vapor deposition (CVD), sputtering, etching and the like.

A thin film probe means a thin film of 10 µm to 100 µm in thickness provided with contact terminals to come into contact with the object of inspection and wiring laid from it, electrodes for external contact being formed on the wiring.

A POGO pin is a contact needle which has a contact pin (plunger) and is electrically connected to an electrode (terminal) by being pressed against the electrode (terminal) by a spring (coil spring). It may have a configuration in which, for instance, a spring arranged within a metal pipe (holding member) transmits an elastic force to the contact pin via a metal ball.

A probe card is a structure having contact terminals which come into contact with the object wafer to be inspected and a multi-layered wiring board, and a semiconductor inspection apparatus means an inspection apparatus having a probe card and a sample supporting arrangement on which to mount the wafer to be inspected.

Probing is an electrical test which is conducted with a prober on a wafer that has gone through a wafer process. When a semiconductor integrated circuit is put to this electrical test, the tip of each contact terminal is brought into contact with an electrode formed on the main face of the chip area. It involves functional tests to check whether or not the device performs its functions as prescribed and tests on DC operation characteristics and AC operation characteristics to distinguish between satisfactory and rejectable products. It is distinguished from the screening test (final test) conducted after division into individual chips (or after the completion of packaging).

Burn-in inspection is screening to identify chips which may turn out defective in the future by applying temperature and voltage stress.

Multiple chip simultaneous testing means simultaneous electrical inspection of a semiconductor integrated circuit for a plurality of chip areas and, in particular, ultra-multiple chip simultaneous testing means simultaneous electrical inspection of a semiconductor integrated circuit for about 64 or more chip areas (about 1,000 pins or more).

Known Good Die (KGD) means a guaranteed good chip which is mounted in a bare chip state, such as in flip chip bonding. That a chip is guaranteed to be good in this context means that it has been screened by an inspection comparable to what is done on packaged products.

An index time is the length of time taken, when chips or wafers are consecutively inspected, from the completion of the inspection of one chip or wafer until the completion of the positioning of the next chip or wafer to be ready for the start of inspection.

In the following description of preferred embodiments of the invention, the description may refer to a plurality of sections or embodiments into which the invention is split when such a manner of description is required for the sake of convenience, however, split parts are not unrelated to one another, but one may be a modification, represent details or provide a supplementary description of part or the whole of another.

Further in the following description of the embodiments, whenever the number or the like (number, value, quantity, range and so forth) of any element is referred to, unless expressly stated otherwise or the principle of the invention evidently limits the number or the like, the pertinent element is not limited to that specific number or the like, but can be in any other number, greater or smaller.

Further, regarding the following embodiments, the mention of any constituent element (or elemental step or the like) obviously is not necessarily indispensable, unless expressly stated to be indispensable or the principle of the invention evidently indicates its indispensability.

Similarly, any mention of the shape, positional relationship or any other factor of any constituent element or the like, in the following description of the embodiments also covers what is in effect similar to or resembles the shape or the like unless expressly stated or the principle of the invention indicates to the contrary. This also applies to the aforementioned number, range and so forth.

In every drawing to be referred to in describing any of the embodiments of the invention, elements having the same functions will be assigned the same reference indicator, and their description will not be repeated.

Some of the drawings to be referred to in describing the embodiments, even if they are plan views, may be partly hatched to make the pertinent parts thereof more readily distinguishable.

In the following description of the embodiments, a metal insulator semiconductor field effect transistor (MISFET) representative of field effect transistors shall be abbreviated to MIS.

The preferred embodiments of the present invention will be described in detail below with reference to the accompanying drawings.

Embodiment 1

Figure 2:
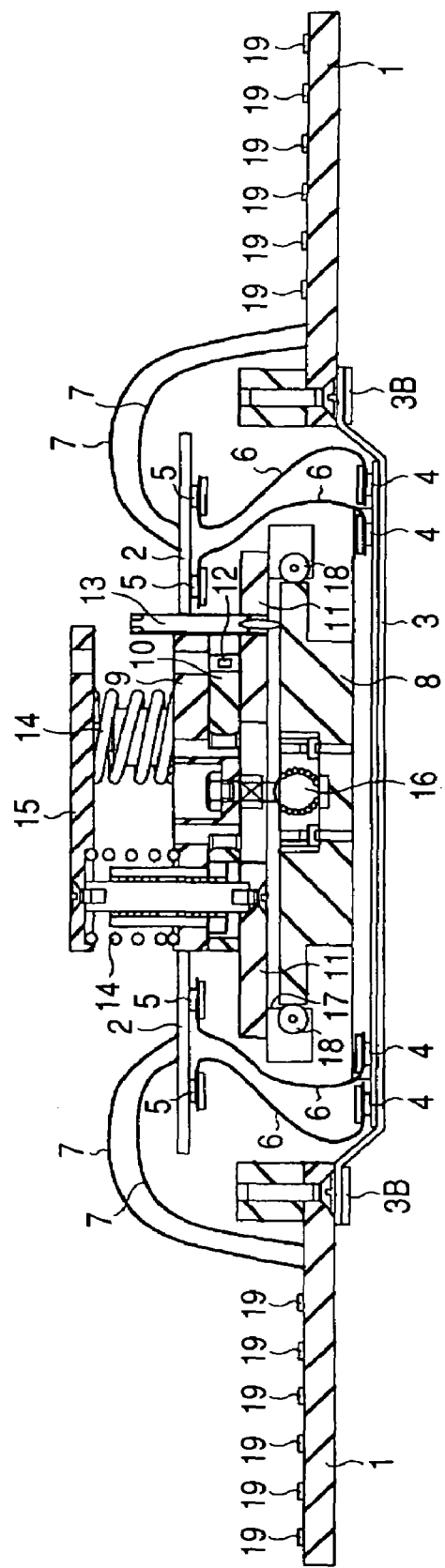
FIG. 2 is a section view taken along line A-A in FIG. 1.

FIG. 1 is a plan view of a probe card (a first card), which represents Embodiment 1 of the invention, and FIG. 2 shows a section taken along line A-A in FIG. 1.

As shown in FIG. 1 and FIG. 2, in the probe card according to Embodiment 1, there are formed, for instance, a multi-layered wiring board (third substrate) 1, an auxiliary substrate 2, suppressing means, a thin film probe (first sheet) 3 and so forth. Further, in the probe card of this Embodiment 1, circuits (wirings) are formed in each of the multi-layered wiring board 1, the auxiliary substrate 2 and the thin film probe 3. By forming circuits in each of the multi-layered wiring board 1, the auxiliary substrate 2 and the thin film probe 3, the need to repair the whole probe card in the event of trouble in any one of the multi-layered wiring board 1, the auxiliary substrate 2 and the thin film probe 3 is dispensed with, but only the member in trouble (the multi-layered wiring board 1, the auxiliary substrate 2 or the thin film probe 3) needs to be replaced. Thus, the time required for repair can be shortened. A connector (fourth electrode) 4 electrically connected to the circuit formed in the thin film probe 3 is disposed over a glass epoxy substrate fitted over the thin film probe 3. A connector 5, which is electrically connected to the circuit formed in the auxiliary substrate 2, is disposed over the auxiliary substrate 2. The connector 4 and the connector 5 are electrically connected by a flexible printed circuit (FPC) cable 6. When it is desired not to let an electrical characteristic, such as an analog clock performance, deteriorate between the connector 4 and the connector 5, a coaxial cable may be used instead of this FPC cable 6. This enables analog clocks, for instance, to be accurately transmitted between the connector 4 and the connector 5. Over the surfaces of the auxiliary substrate 2 and the multi-layered wiring board 1, connection terminals (fifth electrodes 101 (shown in FIG. 2)) for electrical connection to circuits formed within each are provided, and the respectively matching connection terminals are electrically connected to each other by jump wires 7.

For instance, the outer circumference of the thin film probe 3, mainly consisting of polyimide, is fixed to the under face of the multi-layered wiring board 1 by keep rings 3B. On the under face of the thin film probe 3, there are formed a plurality of probes (contact terminals (not shown in FIG. 1 and FIG. 2)) of, for instance, a quadrangular pyramidal or quadrangular truncated pyramidal shape. The circuit (wiring) formed within the thin film probe 3 is electrically connected to each of the probes, and it electrically connects each probe to the connector 4.

The suppressing means is mainly formed of a base holder 8, a slide plate 9, a level plate 10, a guide ring 11, a set screw 12, a spring plunger 13, a compression spring 14, a stopper 15 and a spherical bearing 16.

The base holder 8 bears the load that arises when the probe card is brought into contact with the wafer to be inspected, and it prevents the probe card from being distorted or otherwise affected by that load. The probes disposed on the thin film probe 3 are thereby prevented from deviating from their positions relative to the electrodes (test pads (first electrodes)) on the main face of the wafer with which the probes come into contact.

The slide plate 9 and the level plate 10 are integrated by the set screw 12, and they are fixed to the guide ring 11 by the elastic force of the compression spring 14 arranged between the slide plate 9 and the stopper 15.

The spring plunger 13 reaches the base holder 8 through a hole bored in the guide ring 11. In this Embodiment 1, the thin film probe 3 is flexible because it mainly consists of polyimide. For this reason, to bring all the probes disposed on the thin film probe 3 into contact with the electrodes on the main face of the wafer, there is a structural arrangement for the spring plunger 13 to suppress, via the base holder 8, the thin film probe 3 in the area in which the probes are formed. Thus, the elastic force of the spring plunger 13 applies certain pressure on the base holder 8. Incidentally, a probe card having a structure in which a spring plunger suppresses probes to bring all of the probes into contact with pads on the chip is also described in, for instance, the Japanese Unexamined Patent Publication No. 2001-159643.

In the central area of the multi-layered wiring board 1, there is an opening 17, whose side walls are provided with a plurality of cam followers 18. These cam followers 18 have a function to guide the base holder 8 into the opening 17 and position the base holder 8 within the opening 17.

A plurality of POGO seats 19 for electrical connection to circuits formed in the multi-layered wiring board 1 are disposed over the top face of the multi-layered wiring board 1. These POGO seats 19 have a function to accept pins for letting signals received from a tester into the probe card.

Figure 3:
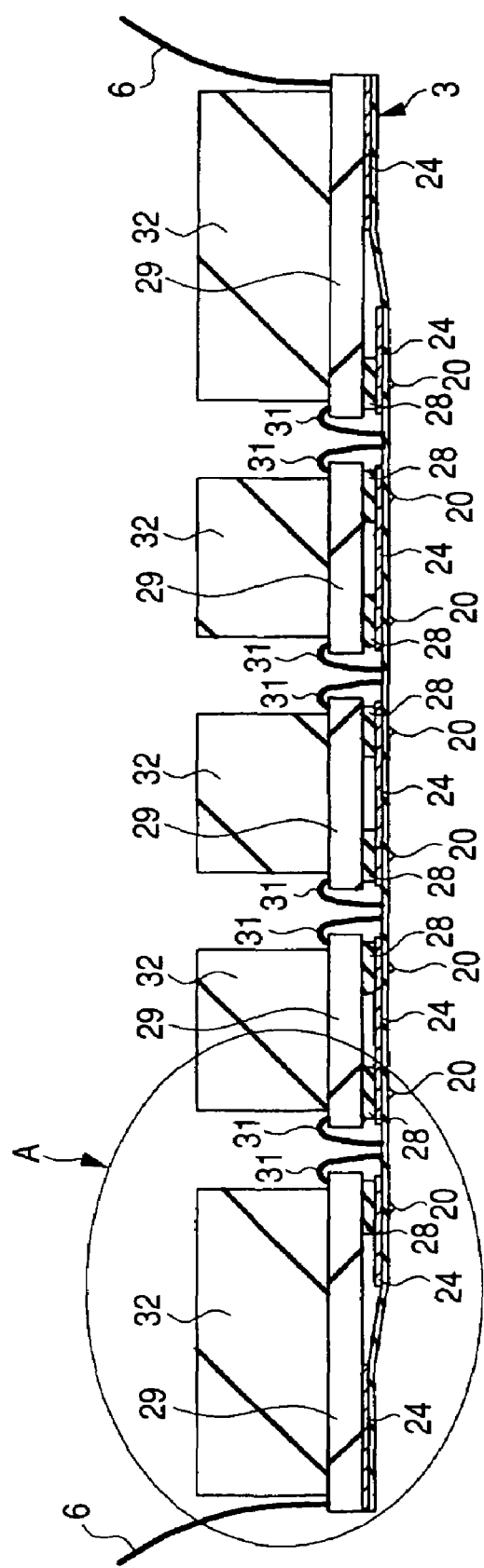
FIG. 3 is a section view showing an enlarged view of a representative part of a thin film probe contained in the probe card, which represents Embodiment 1 of the invention.
Figure 4:
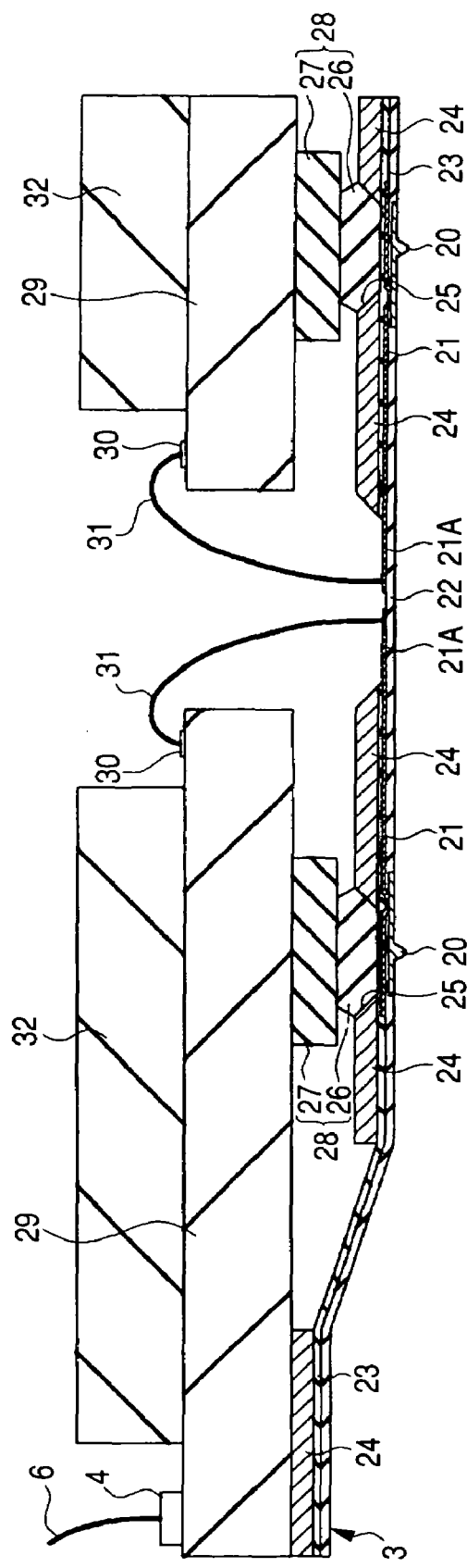
FIG. 4 is a section view showing an enlarged view of area A in FIG. 3.

FIG. 3 is an enlarged section view of the thin film probe 3, and FIG. 4 shows an enlarged view of area A in FIG. 3.

A plurality of protrusive probes (contact terminals) 20 of, for instance, a quadrangular pyramidal or quadrangular truncated pyramidal shape are formed on the under face (first face) of the thin film probe 3. On the top face (second face) of the thin film probe 3, wires 21 are led out of the probes 20, and one end of each wire is exposed on a polyimide film 22 to constitute a bonding pad (second electrode) 21A.

A polyimide film 23 is formed over the polyimide film 22, and reinforcements 24 are formed over this polyimide film 23. These polyimide films 22 and 23 constitute the main components of the thin film probe 3. A material having a substantially equal linear expansion ratio (coefficient of thermal expansion) relative to the wafer to be inspected is selected for the reinforcements 24. This enables the positions of the probes 20 and the electrodes (test pads) formed over the main face of the wafer relative to each other to be kept constant even if the temperature varies. As a result, each of the probes 20 can be securely brought into contact with the prescribed electrode (test pad). Examples of preferable material for the reinforcements 24, where the wafer to be inspected mainly consists of silicon, include silicon and 42 Alloy.

Above the probes 20, a groove (second opening) 25 is cut in each reinforcement 24, and an elastomer (first elastic material) 26 is so formed as to fill this groove 25 and overflow the groove 25 upward by a prescribed quantity. Further, above this elastomer 26, an elastomer (second elastic material) 27 is formed, and the elastomer 26 and the elastomer 27 together constitute a suppressing mechanism 28. In this Embodiment 1, since the elastomer 26 is arranged within each groove 25, a material of adequate printability should be selected for the elastomer 26. Further in this Embodiment 1, a softer material (lower in elastic ratio) is selected for the elastomer 26 than for the elastomer 27. Even if the wafer to be inspected is warped or otherwise distorted, for instance, and an unevenness in height has arisen among the plurality of electrodes (test pads) with which the probes 20 are to come into contact or among the plurality of probes 20, this difference in elasticity makes it possible to bring the probes 20 into contact with the electrodes (test pads). In such a case, the elastomer 26 absorbs the height fluctuations among the plurality of electrodes (test pads) with which the probes 20 are to come into contact or among the plurality of probes 20 or among both, while the elastomer 27 absorbs any distortion of the wafer to be inspected. As a result, the throughput of electrical inspection of semiconductor integrated circuits using the probe card of this Embodiment 1 can be enhanced. The elastomer 26 also has a function to ease the impact of the probes 20 coming into contact with the electrodes (test pads), and to reduce the stress working on the thin film probe 3 when the thin film probe 3 comes into contact with the outer circumference of the wafer to be inspected.

A glass epoxy substrate (first substrate) 29 is fitted over the elastomer 27. Wiring (first circuit) is formed in multiple layers in this glass epoxy substrate 29, over whose top face (main face) pads (third electrodes) 30, which are electrically connected to that wiring and the aforementioned connector 4, are disposed. The wiring formed in the glass epoxy substrate 29 functions as a relaying circuit for electrically connecting the thin film probe 3 and the auxiliary substrate 2 (see FIG. 2). The pads 30 and the bonding pads 21A, which constitute part of the wires 21 formed over the thin film probe 3, are electrically connected by wires (first wires) 31 formed of gold (Au) for instance. The diameter of the wires 31 is so set as to provide a current capacity matching the amperage of the current flowing through the wires 31 at the time of probing, and for this Embodiment 1 about 20 µm to 50 µm, more preferably around 30 µm, can be cited as examples. As this electrical connection can be achieved from the probes 20 to the circuits (wiring) formed in the multi-layered wiring board 1 (see FIG. 1 and FIG. 2), the contact of the probes 20 with the electrodes (test pads) formed on the main face of the wafer to be inspected makes possible probing (electrical inspection) with the semiconductor integrated circuit of this Embodiment 1.

Over the top face of the glass epoxy substrate 29, reinforcing plates 32 are fitted to increase the mechanical strength of the glass epoxy substrate 29. In this Embodiment 1, a material that is synthetic and flat, can suppress thermal expansion and contraction of the glass epoxy substrate 29 and has a substantially equal linear expansion ratio (coefficient of thermal expansion) relative to the wafer to be inspected is selected for the reinforcing plates 32. Such a material can restrain the thermal expansion or contraction of the glass epoxy substrate 29 from causing deviations of the positions of the probes 20 and the electrodes (test pads) relative to each other even if the temperature varies. The probes 20 can be kept securely in contact with respectively prescribed electrodes (test pads). Examples of a preferable material for the reinforcing plates 32, where the wafer to be inspected mainly consists of silicon, include ceramic and 42 Alloy.

Figure 5:
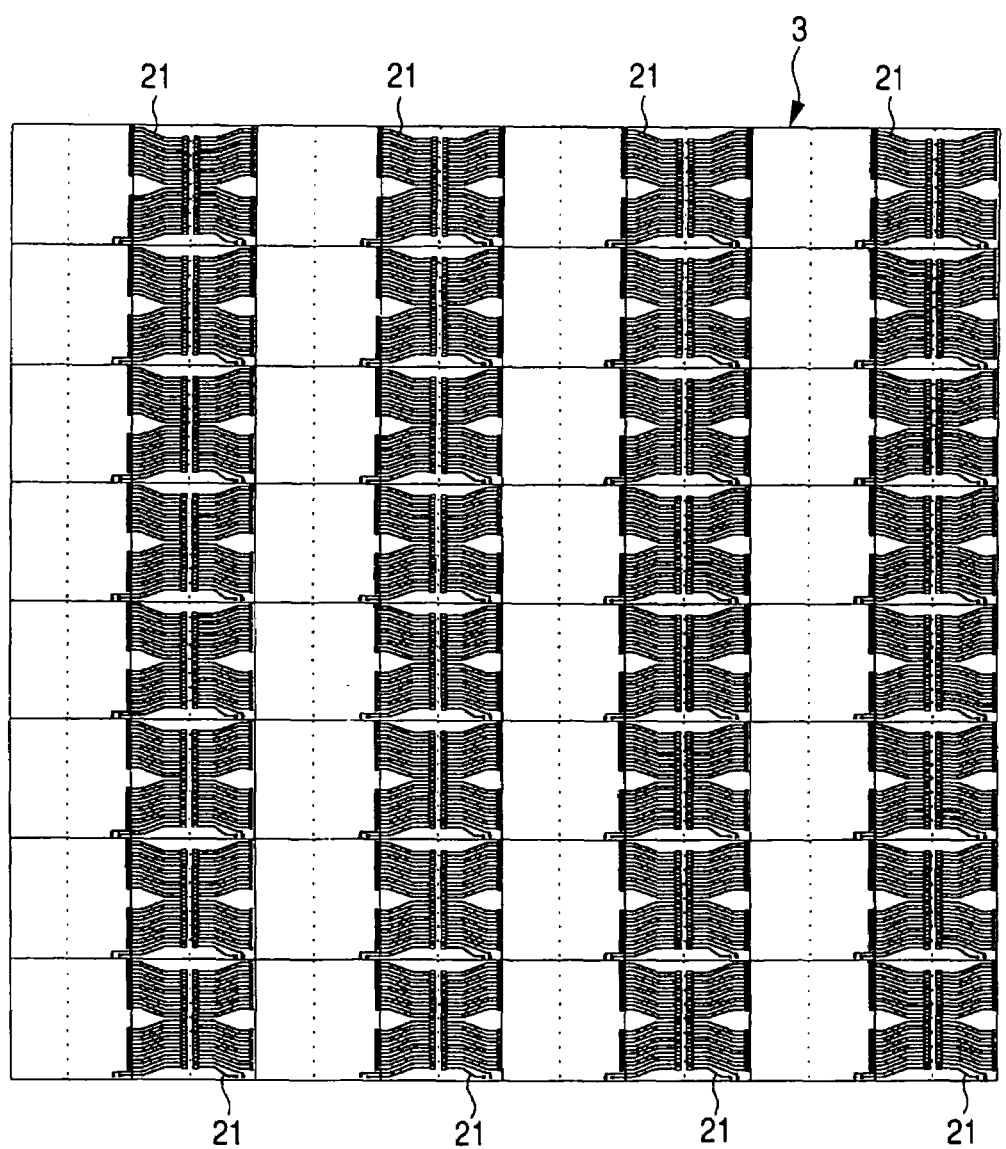
FIG. 5 is a plan view of the thin film probe contained in the probe card, which represents Embodiment 1 of the invention.
Figure 6:
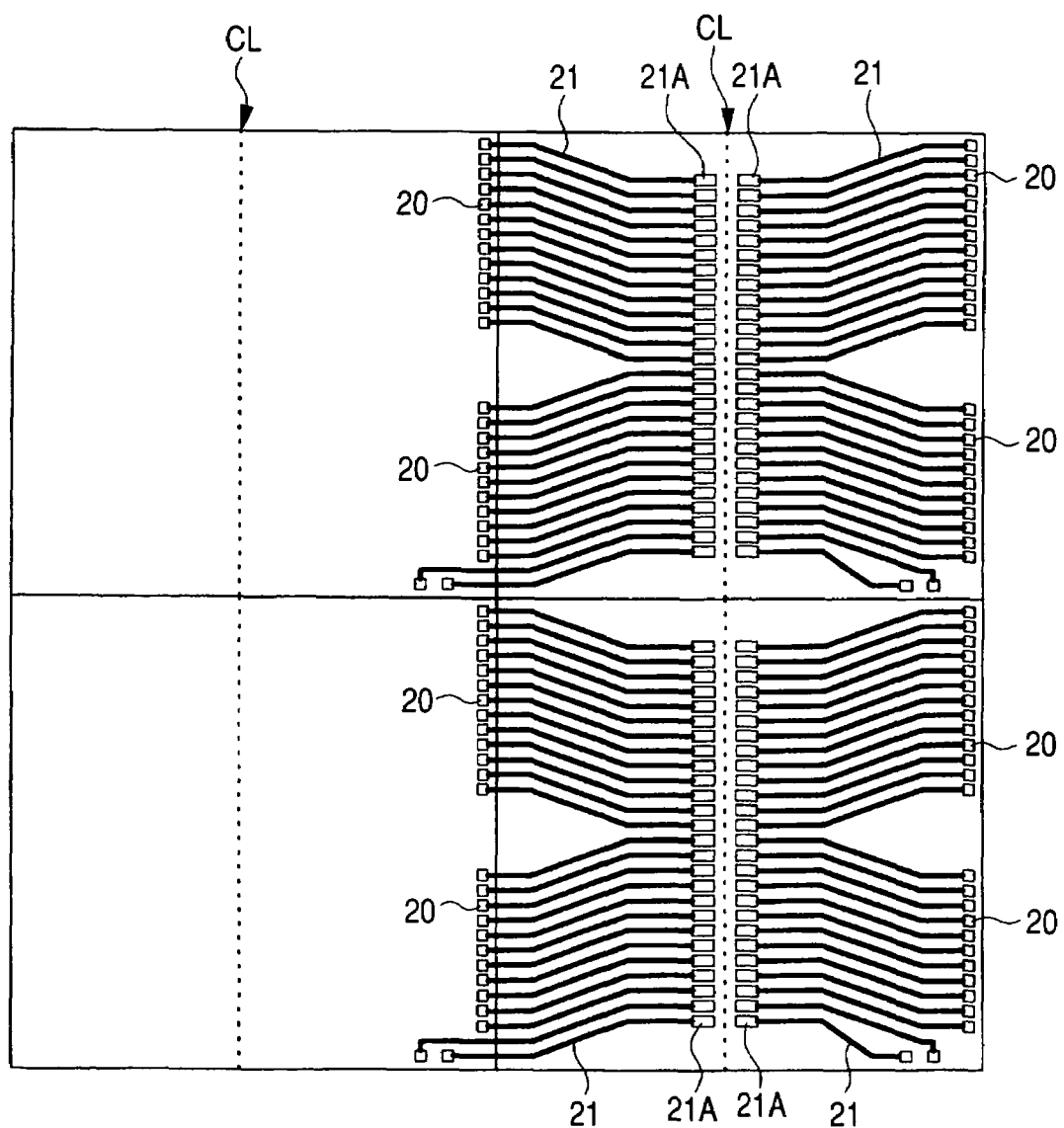
FIG. 6 is a plan view showing an enlarged view of one part of the thin film probe shown in FIG. 5.

FIG. 5 is an overall plan view of the thin film probe 3 mentioned above with particular focus on the arrangement pattern of the wires 21. The configuration illustrated therein permits simultaneous inspection of a total of, for instance, 64 chip areas consisting of eight areas, each arranged vertically and horizontally. FIG. 6 shows part of its planar pattern, wherein a plan view of a portion corresponding to four chip areas is shown in an enlarged view. In FIG. 6, the probes 20 are shown only in their end positions, wherein 26 pins of the probes 20 are arranged per chip area.

As shown in FIG. 6, the probes 20 are positioned where they are matched with the electrodes (test pads) on the main face of the wafer. The bonding pads 21A are so patterned as to facilitate bonding of the wires 31 (see FIG. 4). In this Embodiment 1, a plurality of the bonding pads 21A are arrayed along a straight line CL passing through the center of each chip area in the vertical direction of the sheet on which FIG. 6 is drawn.

In the thin film probe 3 described above, as the tips of the probes 20 are arranged to match the positions of the electrodes (test pads) all over the main face of the wafer to be inspected and the bonding pads 21A are so patterned that the wires 31 to be electrically connected the probes 20 can be readily bonded, even if the chip size is reduced and the electrodes (test pads) are also reduced in size and narrowed in pitch, semiconductor integrated circuits can be inspected at the wafer level irrespective of the arrangement of the electrodes (test pads).

Figure 7:
FIG. 7 is another plan view of the thin film probe contained in the probe card, which represents Embodiment 1 of the invention.
Figure 8:
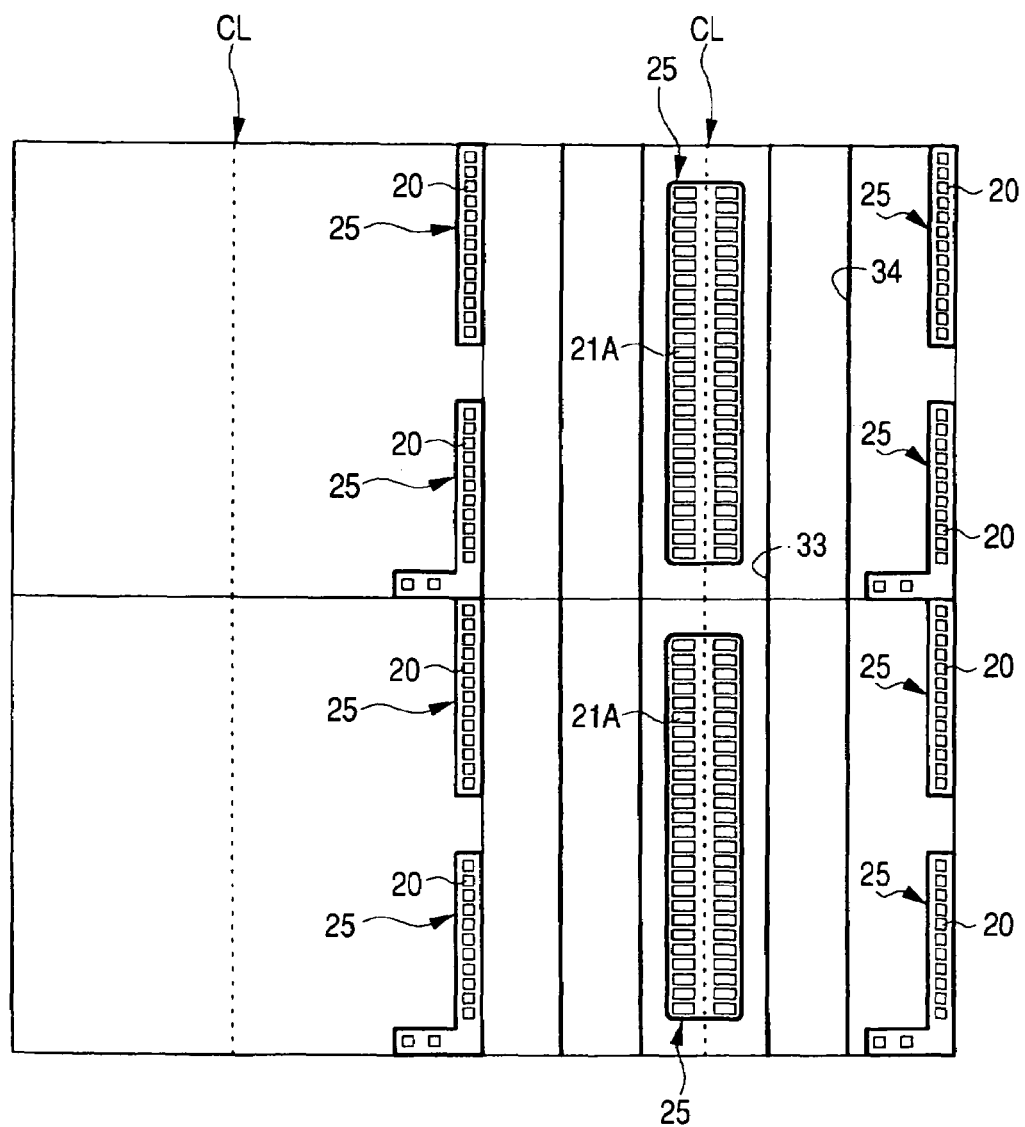
FIG. 8 is an enlarged plan view of another part of the thin film probe shown in FIG. 5.

FIG. 7 is an overall plan view of the thin film probe 3 mentioned above with particular focus on the arrangement pattern of the reinforcements 24, the glass epoxy substrate 29 and the reinforcing plates 32. Like the configuration shown in FIG. 5 referred to above, the configuration illustrated therein permits simultaneous inspection of a total of, for instance, 64 chip areas consisting of eight, areas each arranged vertically and horizontally. FIG. 8 shows part of its planar pattern, wherein a plan view of a portion corresponding to four chip areas is shown in an enlarged view. In FIG.

8, as in FIG. 6, the probes 20 are shown only in their end positions, wherein 26 pins of the probes 20 are arranged per chip area.

As shown in FIG. 7 and FIG. 8, areas in which the grooves 25 for arranging the elastomer 26 (see FIG. 4) are to be formed and in which areas in the bonding pads 21A are to be exposed are provided in the top surface of the thin film probe 3, and the reinforcements 24 are formed everywhere else than at these areas. In the areas where the bonding pads 21A are exposed, grooves 24A are cut in the reinforcements 24, openings 33 are formed in the glass epoxy substrate 29, and openings 34 are formed in the reinforcing plates 32. As stated above, since the reinforcements 24 are formed of a material having a substantially equal linear expansion ratio (coefficient of thermal expansion) relative to the wafer to be inspected, the formation of the reinforcements 24 over a large area of the top face of the thin film probe 3 enables the relative positions of the contact terminals 20 and the electrodes (test pads) formed over the main face of the chip area to remain securely matched even if the temperature varies.

Incidentally, in order to bring the probes 20 (see FIG. 4) into contact with the electrodes (test pads) in the chip area to establish electrical continuity between the probes 20 and the electrodes (test pads), a natural oxide film (not shown) formed over the surface of the electrodes (test pads) should be broken to bring the probes 20 into contact with the electrodes (test pads). If here a probe card having cantilevered probe needles is used instead of the probes 20 (see FIG. 4) which the probe card of Embodiment 1 has, the natural oxide film will have to be broken by wiping the probes after the probes and the electrodes (test pads) come into contact. However, the wiping not only would break the natural oxide film, but also might damage the surface of the electrodes (test pads) themselves. Once the surface of the electrodes (test pads) is damaged thereby, the bonding force between the electrodes (test pads) and the bonding wires may weaken when the electrodes (test pads) and the bonding wires are connected at a subsequent step. Also, as the reduced chip size entails a reduced size of the electrodes (test pads) as well, the proportion of the damaged area in the surface of the electrodes (test pads) increases, and this may invite weakening of the bonding force between the electrodes (test pads) and the bonding wires.

On the other hand, the tips of the probes 20 of this Embodiment 1 are caused, by the suppressing force of the suppressing mechanism 28 (see FIG. 4), to pierce the natural oxide film to reach the surface of the electrodes (test pads) themselves to establish electrical continuity between the probes 20 and the electrodes (test pads). As this configuration makes the wiping unnecessary, the required duration of contact between the probes 20 and the electrodes (test pads) can be reduced. As a result, compared with the use of contact terminals consisting of cantilevered probe needles, the damage inflicted on the surface of the electrodes (test pads) can be reduced. Thus, the problem of a weakened bonding force between the bonding wires and the electrodes (test pads) connected at a subsequent step can be prevented. Also, as the wiping is made unnecessary, the size of the electrodes (test pads) can be reduced, and this makes it possible to reduce the chip size.

Further, according to an experiment conducted by the present inventors, in a probe card which is enabled to transmit and receive test signals to and from probes by the coming into contact of POGO pins with a thin film probe, such as the one described in the Japanese Patent Application No. 2003-075429, the elastic force of the springs which the POGO pins have imposes a load on the thin film probe on account of the electrical connection between the POGO pins and the thin film probe, and that load is transmitted to the probes. For this reason, the load working on the electrodes (test pads) when the probes come into contact with the electrodes (test pads) was found to be about 6 g to 8 g per electrode (test pad). On the other hand, in the case of the probe card of this Embodiment 1 as described above, the load working on the electrodes (test pads) when the probes 20 and the electrodes (test pads) come into contact with each other was about 1 g to 2 g per electrode (test pad). Thus, where the probe card of this Embodiment 1 is used, the load working on the electrodes (test pads) when the probes 20 and the electrodes (test pads) come into contact with each other can be smaller than where the probe card using POGO pins is used. This means that, for the wafer to be inspected, low-permittivity insulating films of a low mechanical strength can be used as inter-layer insulating films in the process of forming semiconductor elements and wiring. Thus, where probing is carried out with a probe card of this Embodiment 1, damage to inter-layer insulating films, semiconductor elements and wiring can be reduced. Since the POGO pins referred to above are expensive, the probe card of this Embodiment 1 can be reduced in its own cost compared with a probe card using POGO pins.

Incidentally, in an attempt to reduce the chip size, the electrodes (test pads) may be provided over an active element or wiring electrically connected to the active element. It is feared that, if probes come into contact with such electrodes (test pads) at the time of probing, the impact of this contact may destroy the active element and/or wiring underneath. As described above, where the probe card of this Embodiment 1 is used, the load working on the electrodes (test pads) when the probes 20 and the electrodes (test pads) come into contact with each other can be reduced, and, accordingly, such a problem can be prevented.

Or, where semiconductor integrated circuit devices are to be fabricated by a wafer process package (hereinafter abbreviated to WPP) technique, bump electrodes which are to serve as the external connection terminals of each semiconductor integrated circuit device are formed after collective resin sealing of the wafer as it is in the wafer state, and individual semiconductor integrated circuit devices (chips) are cut out of the wafer. Where the wafer to be inspected as described above has already been processed by this WPP technique, the bump electrodes become the test pads. Since the load working on the electrodes (test pads) when the probes 20 and the electrodes (test pads) come into contact with each other can be reduced where the probe card of this Embodiment 1 is used, as stated above, if such a wafer is probed by use of the probe card of this Embodiment 1, the indentations formed by the probes 20 in the surface of the bump electrodes can be made smaller and shallower. By melting the bump electrodes by reflowing and joining them with pads on the package substrate side at a subsequent step, joining failure between the bump electrodes and the pads on the package substrate side can be prevented from occurring when the semiconductor integrated circuit devices are mounted on the package substrate.

Also, it is feared that, when the thin film probe 3 comes into contact with the outer circumference of the wafer to be inspected, the load working on the probes 20 positioned near the outer circumference of the wafer may increase to thereby crush the tips of the probes 20, or some other damage may occur. However, since the load working on the electrodes (test pads) when the probes 20 and the electrodes (test pads) come into contact with each other can be reduced where the probe card of this Embodiment 1 is used, as stated above, such damage can be prevented.

Next, the process used in the fabrication of the thin film probe 3 that has been described with reference to FIG. 4 through FIG. 8 above will be described with reference to FIG. 9 through FIG. 17. FIG. 9 through FIG. 17 show sectional views of representative parts in the fabrication of the thin film probe 3. Incidentally, the structure of the thin film probe and its fabrication process and the structure of a probe similar to the probes 20 and its fabrication process are also described in the Patent Application No. Hei 6(1994)-22885, Unexamined Patent Publication No. Hei 7(1995)-283280, Unexamined Patent Publication No. Hei 8(1996)-50146, Unexamined Patent Publication No. Hei 8(1996)-201427, Patent Application No. Hei 9(1997)-119107, Unexamined Patent Publication No. Hei 11(1999)-23615, Unexamined Patent Publication No. 2002-139554, Unexamined Patent Publication No. Hei 10(1998)-308423, Patent Application No. Hei 9(1997)-189660, Unexamined Patent Publication No. Hei 11(1999)-97471, Unexamined Patent Publication No. 2000-150594, Patent Application No. 2002-289377, Patent Application No. 2002-294376, Patent Application No. 2003-189949, Patent Application No. 2003-75429, and Patent Application No. 2003-371515, all of Japan.

Figure 9:
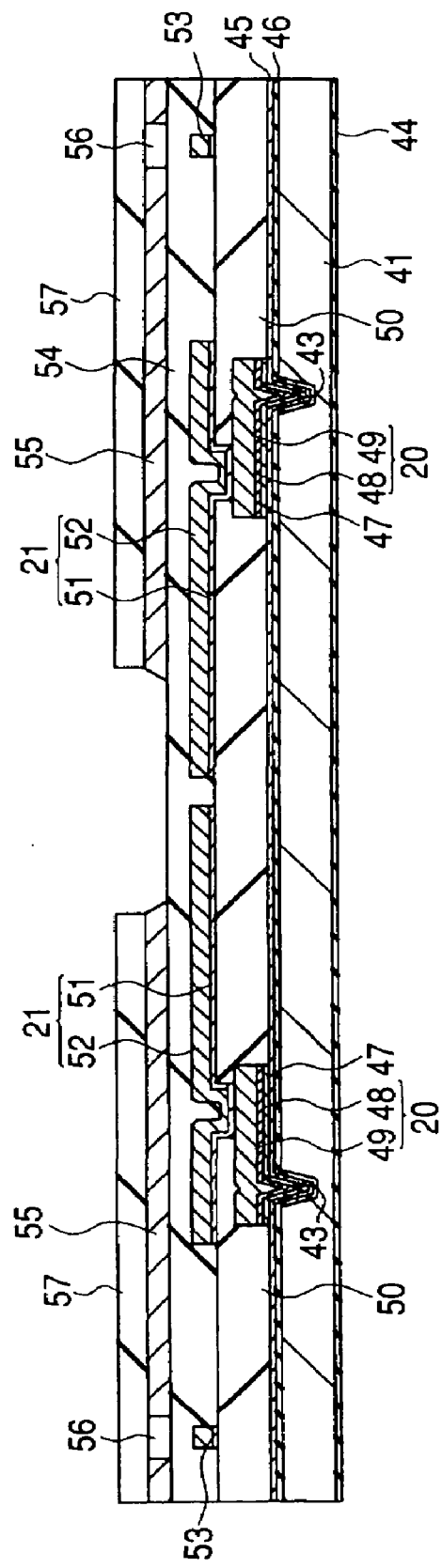
FIG. 9 is a section view showing a step of the fabrication of thin film probes is lustrated in FIG. 4 through FIG. 8.

First, a silicon wafer (second substrate) 41 which is 0.2 mm to 0.6 mm in thickness, as shown in FIG. 9, is prepared, and a silicon oxide film of about 0.5 µm in thickness is formed over both faces of this wafer 41 by thermal oxidation. Then, the silicon oxide film over the main face of the wafer 41 is etched under masking with a photoresist film to bore an opening reaching the wafer 41 into the silicon oxide film over the main face of the wafer 41. Next, a truncated pyramid-shaped hole (first hole) 43, surrounded by a (111) face, is bored in the main face of the wafer 41 by anisotropically etching the wafer 41 with an aqueous solution of a strong alkali (e.g. an aqueous solution of potassium hydroxide) under masking with the remaining portion of the silicon oxide film.

Then, the silicon oxide film used for masking in boring the hole 43 is removed by wet etching with a mixture of hydrofluoric acid and ammonia fluoride. This is followed by thermal oxidation of the wafer 41 to form a silicon oxide film 44 of about 0.5 µm in thickness all over the wafer 41 including the inside of the hole 43. Next, an electroconductive film (first metal film) 45 is formed over the main face of the wafer 41 including the inside of the hole 43. This electroconductive film 45 can be formed by successively stacking, by sputtering or vapor deposition, a chrome film of about 0.1 µm and a copper film of about 1 µm in thickness, for instance. Next, a photoresist film is formed over the electroconductive film 45, and the part of the photoresist film in the area where the probes 20 (see FIG. 4) are to be formed at a later step by photolithography to bore an opening.

Then, electroconductive films (first metal films) 47, 48 and 49 of high hardness are successively stacked by electrolytic plating using the electroconductive film 45 as an electrode over the part of the electroconductive film 45 exposed at the bottom of the opening in the photoresist film. In this Embodiment 1, the electroconductive films 47 and 49 can be nickel films, and the electroconductive film 48, can be a rhodium film, for example. Through the steps up to this point, the aforementioned probes 20 can be formed from the electroconductive films 48 and 49. The electroconductive films 45 and 47 will be removed at a later step, which will be described afterwards.

Next, after removing the photoresist film, the polyimide film (first polyimide film) 22 is so formed as to cover the probes 20 and the electroconductive film 45. Then, an opening (first opening) reaching the probes 20 is bored in that polyimide film 22. This opening can be bored by laser drilling or dry etching under masking with an aluminum film.

Next, an electroconductive film (second metal film) 51 is formed over the polyimide film 22 including the inside of that opening. This electroconductive film 51 can be formed by successively stacking, by sputtering or vapor deposition, a chrome film of about 0.1 µm and a copper film of about 1 µm in thickness, for instance. Next, after a photoresist film is formed over the electroconductive film 51, the photoresist film is patterned by photolithography to bore an opening reaching the electroconductive film 51 in the photoresist film. Then, an electroconductive film (second metal film) 52 is formed by plating over the electroconductive film 51 in that opening. In this Embodiment 1, the electroconductive film 52 can be, for example, a laminated film formed by stacking copper films or a copper film and a nickel film successively upward from the lower layer.

Then, after removing the photoresist film, the wires 21 consisting of the electroconductive films 51 and 52 and alignment marks 53 are formed by etching the electroconductive film 51 under masking with the electroconductive film 52. The wires 21 can be electrically connected to the probes 20 at the bottom of the opening.

Next, a polyimide film (second polyimide film) 23, which is to serve as the adhesive layer, is formed by sticking a polyimide-based adhesive sheet or an epoxy-based adhesive sheet, for instance, to the main face of the wafer 41. Then, a metal sheet (second sheet) 55 is fastened to the upper face of this polyimide film 23. For this metal sheet 55, a material whose linear expansion ratio is low and close to the linear expansion ratio (first linear expansion ratio) of the wafer 41 is to be selected, and in this Embodiment 1, 42 Alloy (an alloy of nickel and iron in a ratio of 42:58%, having a linear expansion ratio of 4 ppm/° C.) or Invar (an alloy of nickel and iron in a ratio of 36:64, having a linear expansion ratio of 1.5 ppm/° C.) can be used, for example. Or, instead of using the metal sheet 55, a silicon film of the same material as the wafer 41 can be formed as well, or an alloy of iron, nickel and cobalt or a mixed material of ceramic and resin about equal to silicon in linear expansion ratio can be used. A peep window 56 is formed in this metal sheet 55 to allow direct visual checking of the alignment marks 53. Fastening of this metal sheet 55 is accomplished by, for instance, superposing the metal sheet 55 in which the peep window 56 is formed over the wafer 41 on which the probes 20 and the alignment marks 53 are formed by use of the alignment marks 53 and the peep window 56 and, while applying pressure of 10 to 200 kgf/cm$^2$, heating them at a temperature not lower than the glass transition point temperature of the polyimide film 23 to achieve hot pressed crimping.

By fastening this metal sheet 55 with the polyimide film 23, the strength and square measure of the thin film probe 3 that is formed can be increased. The fastening of the metal sheet 55 also serves to secure the positional accuracy of the thin film probe 3 and the wafer to be inspected relative to each other by preventing deviation of the thin film probe 3 and the wafer to be inspected from their relative positions due to the temperature at the time of inspection and in various other situations.

Then, the metal sheet 55 is etched under masking with a photoresist film 57. In this Embodiment 1, this can be accomplished by spray etching with a solution of ferric chloride.

Figure 10:
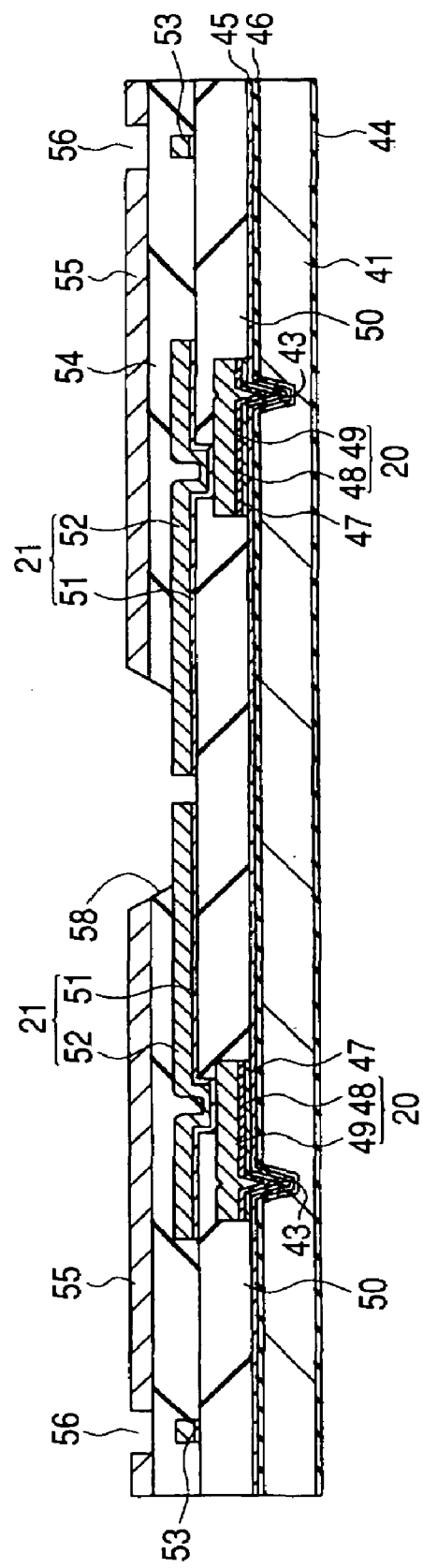
FIG. 10 is a section view showing the step following the step shown in FIG. 9 in the fabrication of thin film probes.

Next, after removing the photoresist film 57, as shown in FIG. 10, the polyimide film 23 is drilled under masking with the metal sheet 55 to bore an opening (third opening) 58 reaching the wires 21. This drilling can be accomplished by, for instance, laser machining using an excimer laser or carbon dioxide laser, or dry etching.

Figure 11:
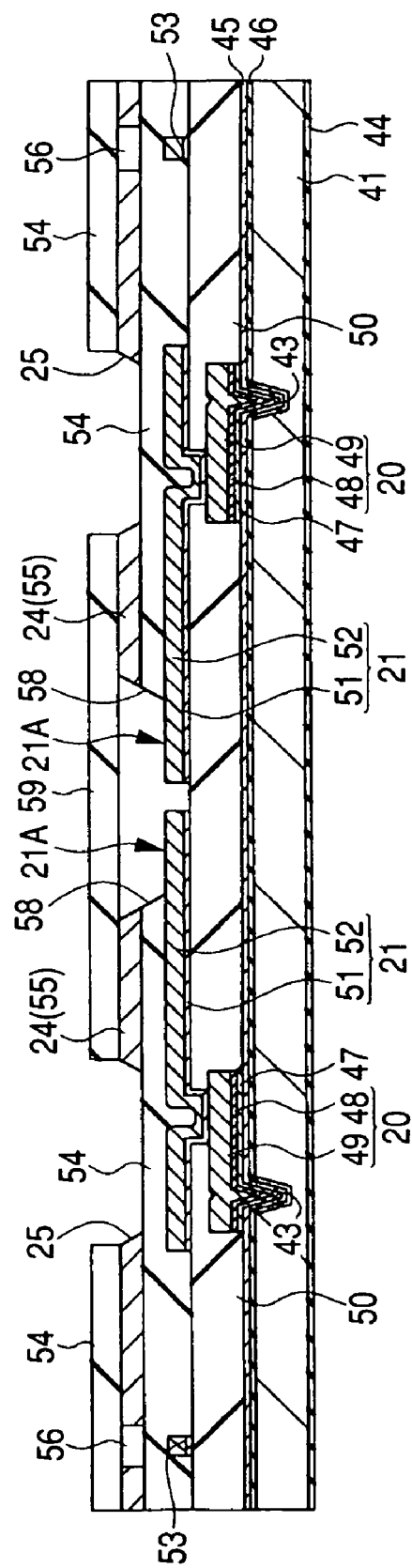
FIG. 11 is a section view showing the step following the step shown in FIG. 10 in the fabrication of thin film probes.

Next, as shown in FIG. 11, the metal sheet 55 is etched by use of a photoresist film 59 to form the aforementioned reinforcements 24 (including grooves 25) consisting of the metal sheet 55. The planar pattern of the reinforcements 24 formed by this etching becomes the planar pattern of the reinforcements 24, which were described with reference to FIG. 7 and FIG. 8.

Figure 12:
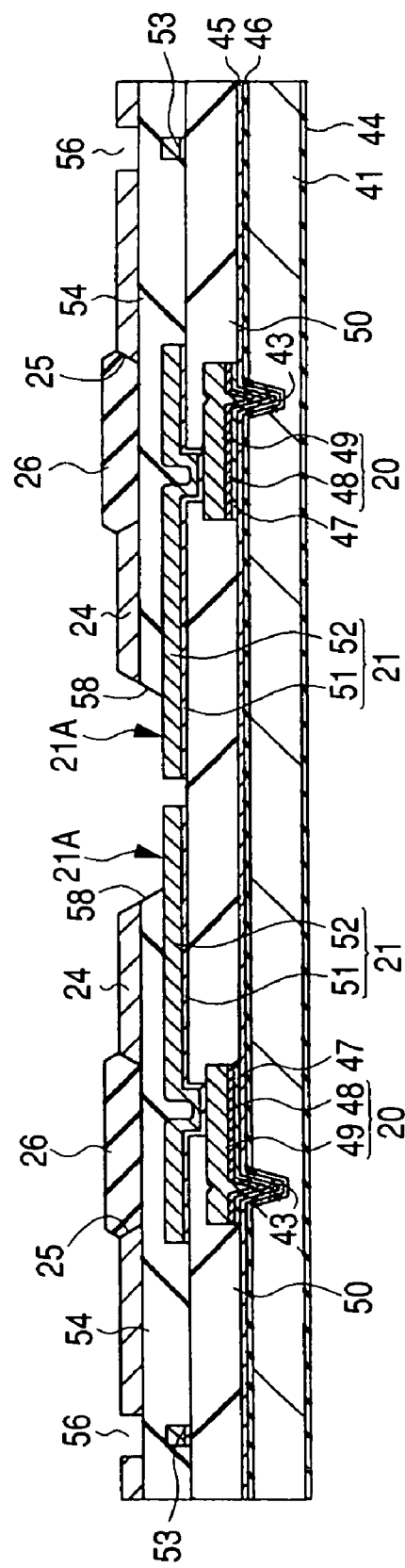
FIG. 12 is a section view showing the step following the step shown in FIG. 11 in the fabrication of thin film probes.
Figure 13:
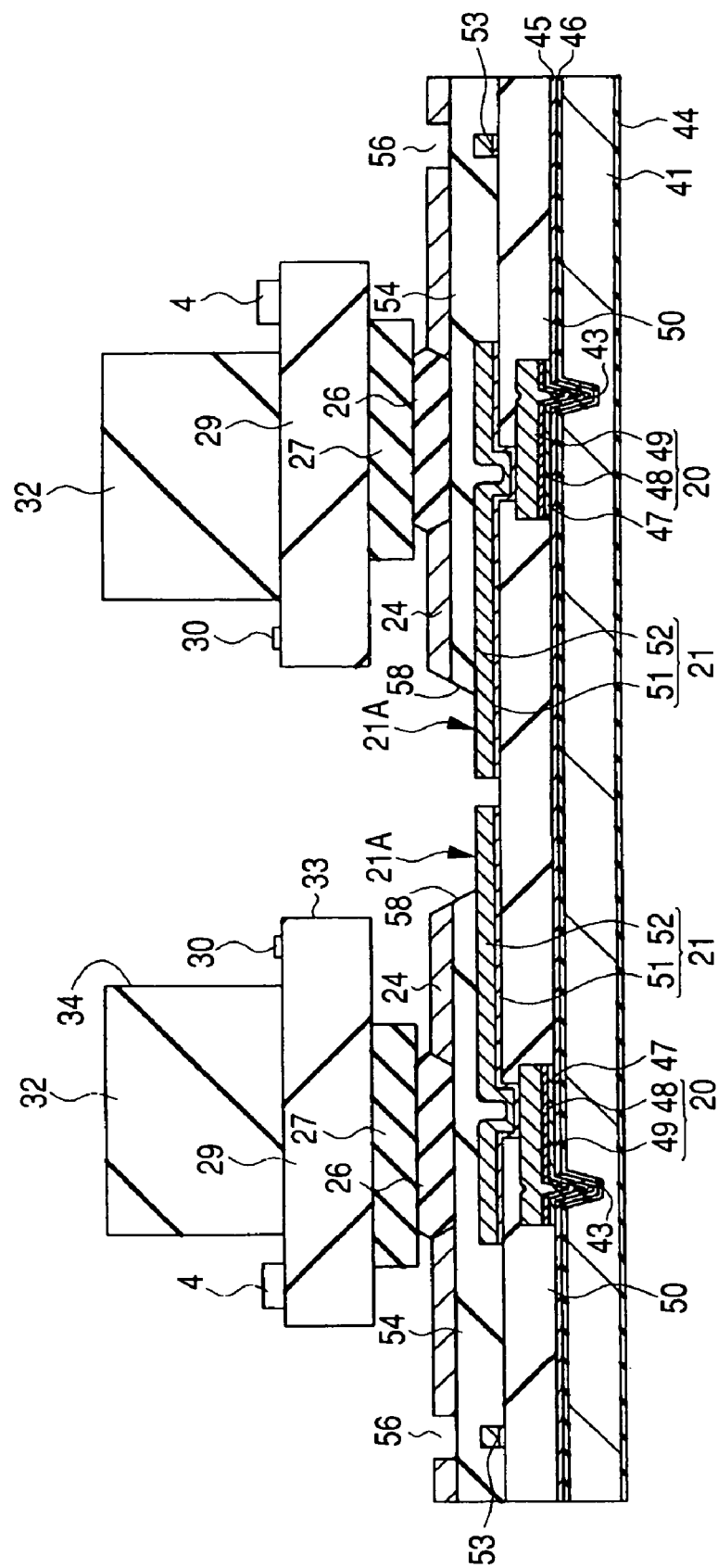
FIG. 13 is a section view showing the step following the step shown in FIG. 12 in the fabrication of thin film probes.

Then, the photoresist film 59 is removed as shown in FIG. 12 and, by exposing the ends the wires 21 at the bottom of the opening 58, the aforementioned bonding pads 21A consisting of the ends of these wires 21 are formed.

Then, the elastomer 26 is formed within the grooves 25. At this step, the elastomer 26 is so formed that a prescribed quantity of it overflows the grooves 25. Methods of forming the elastomer 26 applicable to this Embodiment 1 include printing the inside of the grooves 25 with elastic resin or applying such resin with a dispenser, and installing a silicon sheet thereon. As stated earlier, a softer material (having a lower modulus of elasticity) than that for the elastomer 27 (see FIG. 4) should be selected for the elastomer 26. This choice enables the probes 20 to be in secure contact with the electrodes (test pads) even if, for instance, the wafer to be inspected is warped or otherwise distorted to cause the heights of the plurality of electrodes (test pads) on the main face of the wafer, with which the probes 20 come into contact, to be uneven. Further, the elastomer 26, while easing the impact of the tips of many probes 20 coming into contact with the electrodes (test pads) arrayed on the main face of the wafer to be inspected, absorbs the unevenness of the tip heights of individual probes 20 by local deformation. It thereby helps realize contact between the probes 20 and the electrodes (test pads) by uniform gnawing in compliance with the unevenness of the heights of the electrodes (test pads).

Next, the elastomer 27 described earlier with reference to FIG. 4 is formed over the elastomer 26. Typical methods of forming the elastomer 27 applicable to this Embodiment 1 include the same methods as those cited for the elastomer 26.

Then, the glass epoxy substrate 29, over which the connector 4, the pads 30 and the openings (fourth openings) 33 described with reference to FIG. 1 through FIG. 4 (see also FIG. 7 and FIG. 8) are formed, is stuck over the elastomer 27, with the openings 33 aligned and arranged over the bonding pads 21A. Next, the reinforcing plates 32 in which the openings 34 are formed (see also FIG. 7 and FIG. 8) are stuck over the glass epoxy substrate 29, with the openings 34 aligned and arranged over the bonding pads 21A.

Figure 14:
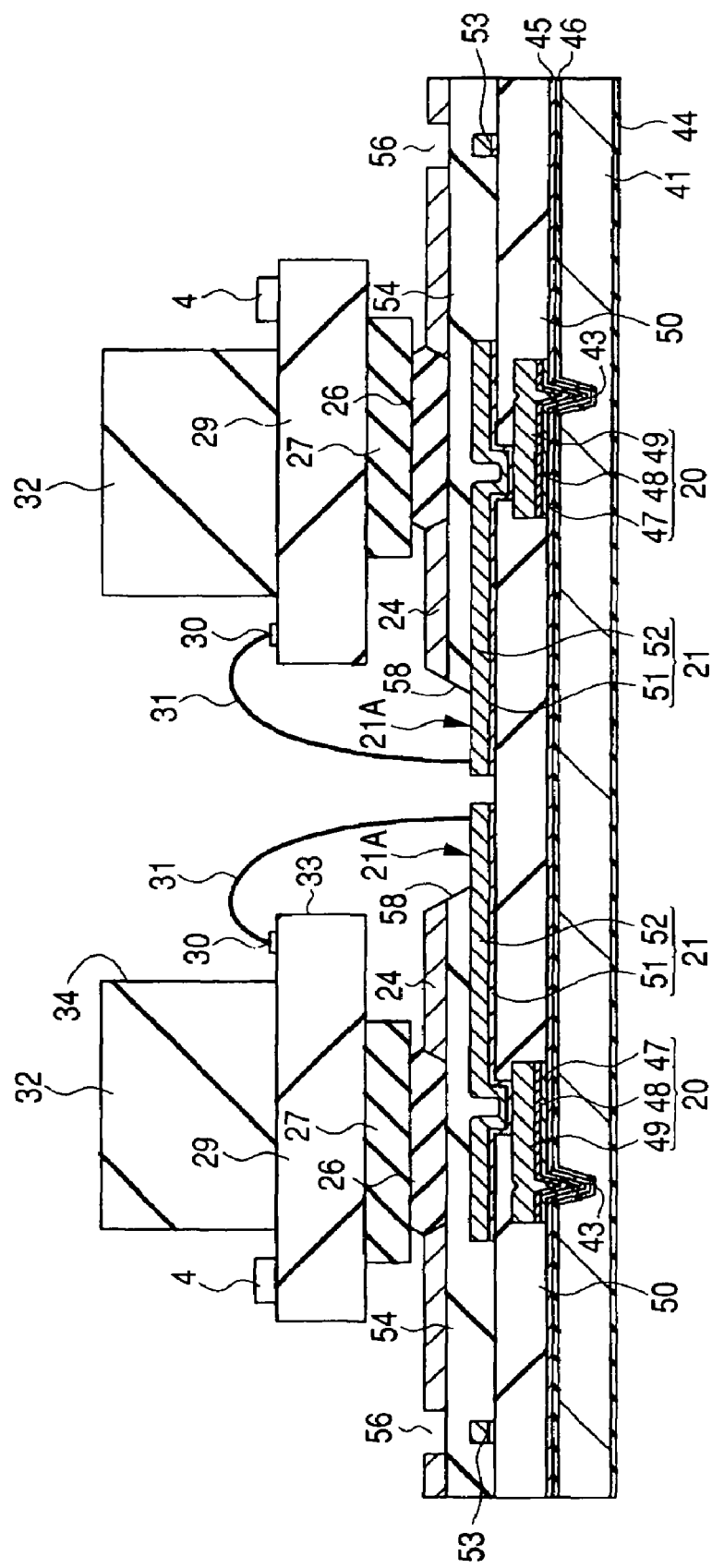
FIG. 14 is a section view showing the step following the step is shown in FIG. 13 in the fabrication of thin film probes.

Next, as shown in FIG. 14, the wires 31 (see also FIG. 3 and FIG. 4) consisting of Au, for instance, are bonded to the pads 30 and the bonding pads 21A to electrically connect the pads 30 and the bonding pads 21A. This bonding step for the wires 31 will be described below in further detail. First, the wafer 41 is heated to around 125° C. Then one-side ends of the wires 31 are bonded to the pads 30 by a hot-crimp wire bonding method with combined use of ultrasound. The capillaries (not shown) used for bonding the wires 31 to the pads 30 then perform their function by imposing a load of about 50 g to 150 g, more preferably about 80 g, to the bonding portion for approximately 0.1 second to 0.2 second while applying ultrasonic vibration of about 120 kHz in frequency, for instance, to the bonding portion. The frequency of the ultrasound is not limited to approximately 120 kHz, but can be any other appropriate frequency, for instance about 90 kHz or about 190 kHz. Then, the other-side ends of the wires 31 are bonded to the bonding pads 21A. In this Embodiment 1, the bonding of the wires 31 to the bonding pads 21A can be accomplished, for instance, under the same conditions as those of the bonding of the wires 31 to the pads 30.

Figure 15:
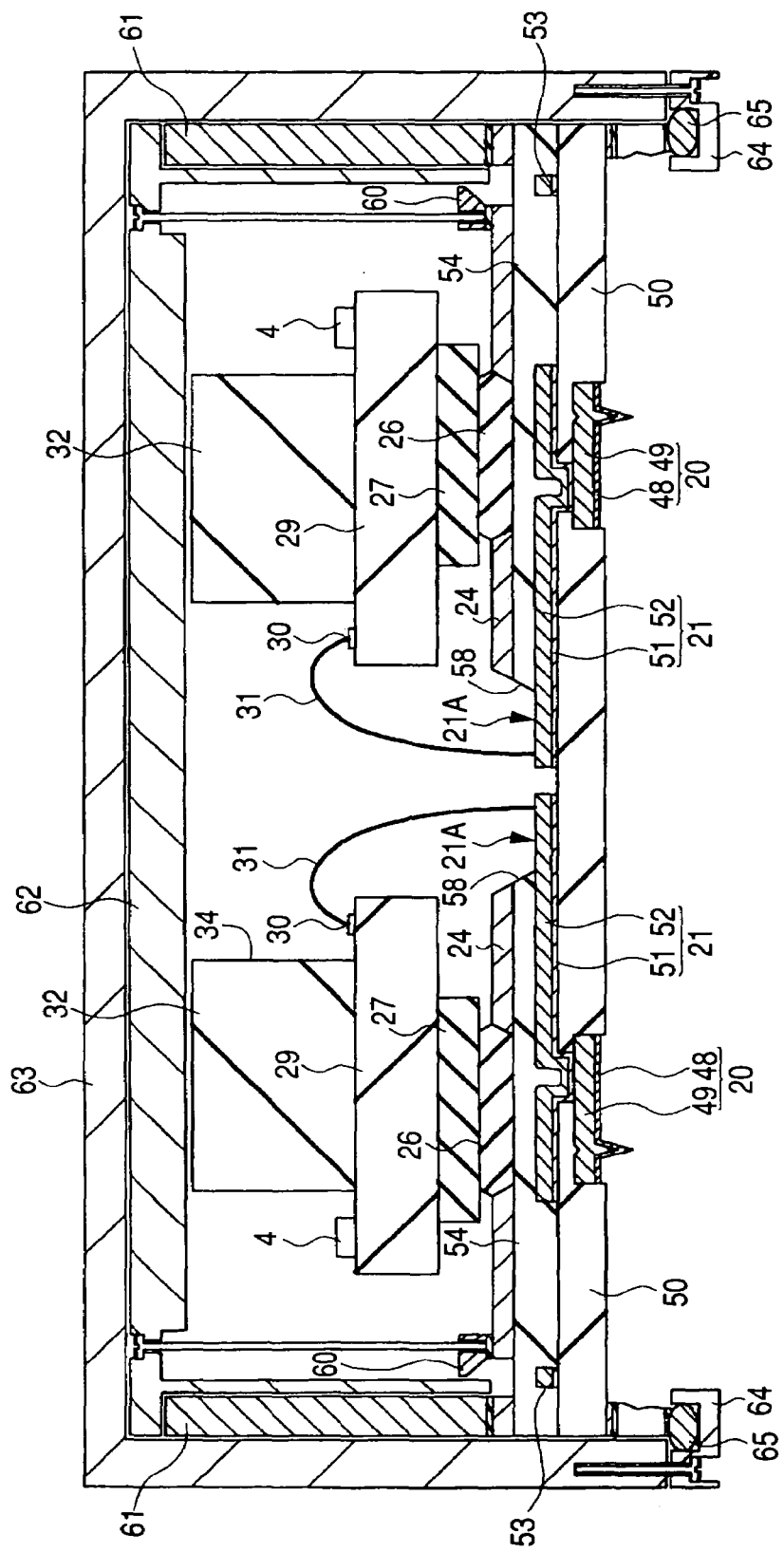
FIG. 15 is a section view showing the step following the step shown in FIG. 14 in the fabrication of thin film probes.

Next, as shown in FIG. 15, a thin film probe frame 60 and a process ring 61 are stuck to the reinforcements 24 with an adhesive. Then, a protective film (not shown) is stuck over the thin film probe frame 60 and process ring 61, and a ring-shaped protective film (not shown) hollowed in the central part is stuck to the rear face of the wafer 41. Next, under masking with those protective films, the silicon oxide film 44 over the rear face of the wafer 41 is removed by etching with a mixture of hydrofluoric acid and ammonia fluoride.

Then, after removing the protective film, a fixed jig for silicon etching is fitted to the wafer 41. This fixed jig for silicon etching is mainly composed of an intermediate fixed plate 62, a stainless steel fixed jig 63, a stainless steel lid 64 and an O ring 65. To fit the fixed jig for silicon etching to the wafer 41, the thin film probe frame 60 is screwed onto the intermediate fixed plate 62, and the wafer 41 is fitted between the fixed jig 63 and the lid 64 with the O ring 65 in-between. After fitting the lid 64 to the wafer 41, the wafer 41, which is the mold for forming the thin film probe 3, is removed by etching with an aqueous solution of strong alkali (e.g. an aqueous solution of potassium hydroxide).

Then, the silicon oxide film 44, the electroconductive film 45 and the electroconductive film 47 are successively removed by etching. In this process, the silicon oxide film 44 is etched with a mixture of hydrofluoric acid and ammonia fluoride, a chrome film contained in the electroconductive film 45 is etched with an aqueous solution of potassium permanganate, and a copper film contained in the electroconductive film 45 and a nickel film which is the electroconductive film 47 are etched with an alkaline copper etching solution. Through the steps so far described, a rhodium film, which is the electroconductive film 48 constituting the probes 20, emerges on the surface of the probes 20. To the probes 20 on whose surface the rhodium film has emerged, solder and aluminum, which are the materials of the plurality of the electrodes (test pads) on the main face of the wafer and with which the probes 20 come into contact, are difficult to adhere, harder and more difficult to be oxidized than nickel, and accordingly contribute to stabilizing the contact resistance.

Figure 16:
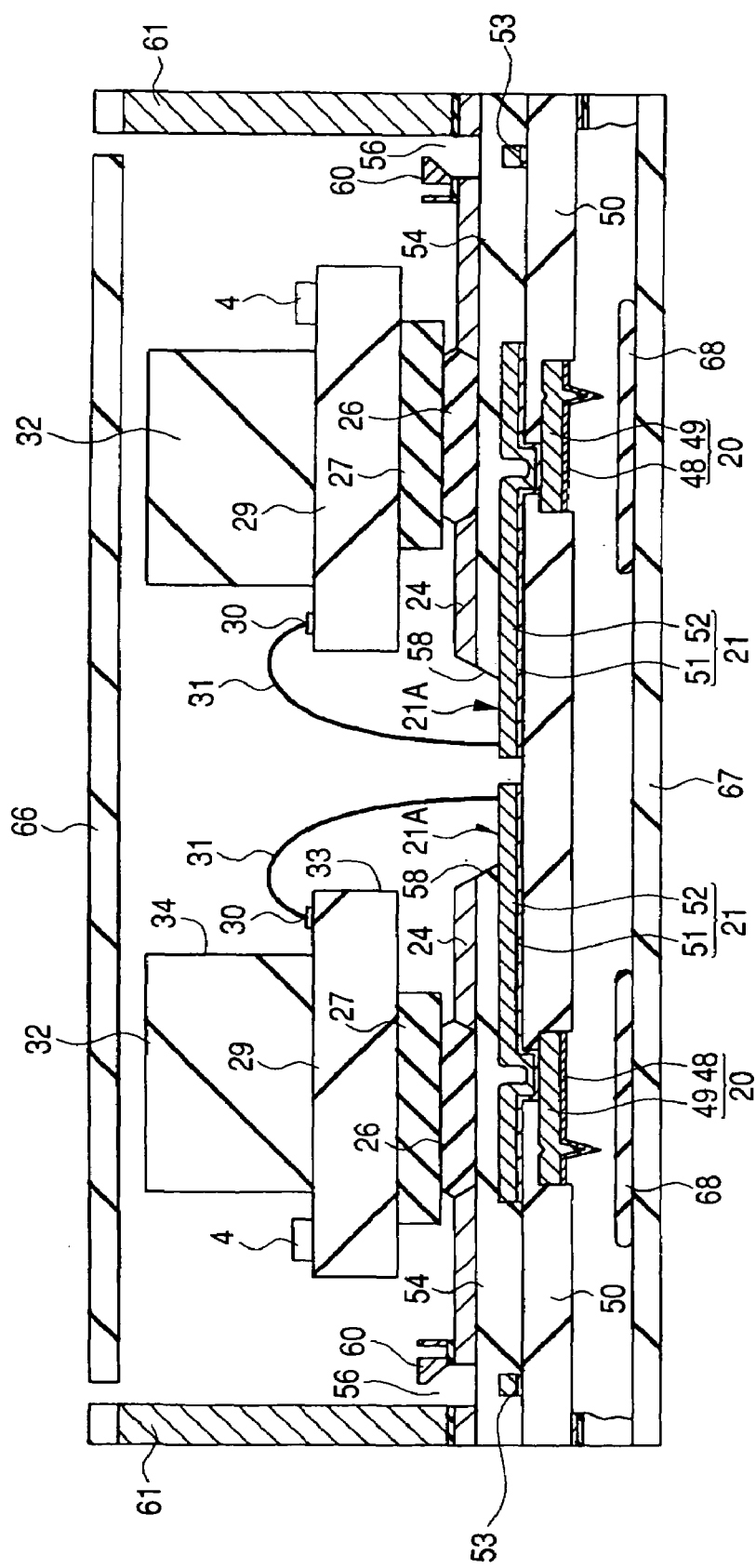
FIG. 16 is a section view showing the step following the step shown in FIG. 15 in the fabrication of thin film probes.

Next, after the fixed jig for silicon etching is removed, as shown in FIG. 16, a protective film 66 is adhered to the face to which the thin film probe frame 60 and the process ring 61 are fitted, and a protective film 67 is adhered to the face on which the probes 20 are formed. At this step, in the area of the protective film 67 opposite the probes 20, pollution-preventive members 68 are arranged to prevent the tips of the probes 20 from coming into contact with the protective film 67 and being contaminated or broken. Then, the parts of the protective film 66 over the alignment marks 53 are removed.

Figure 17:
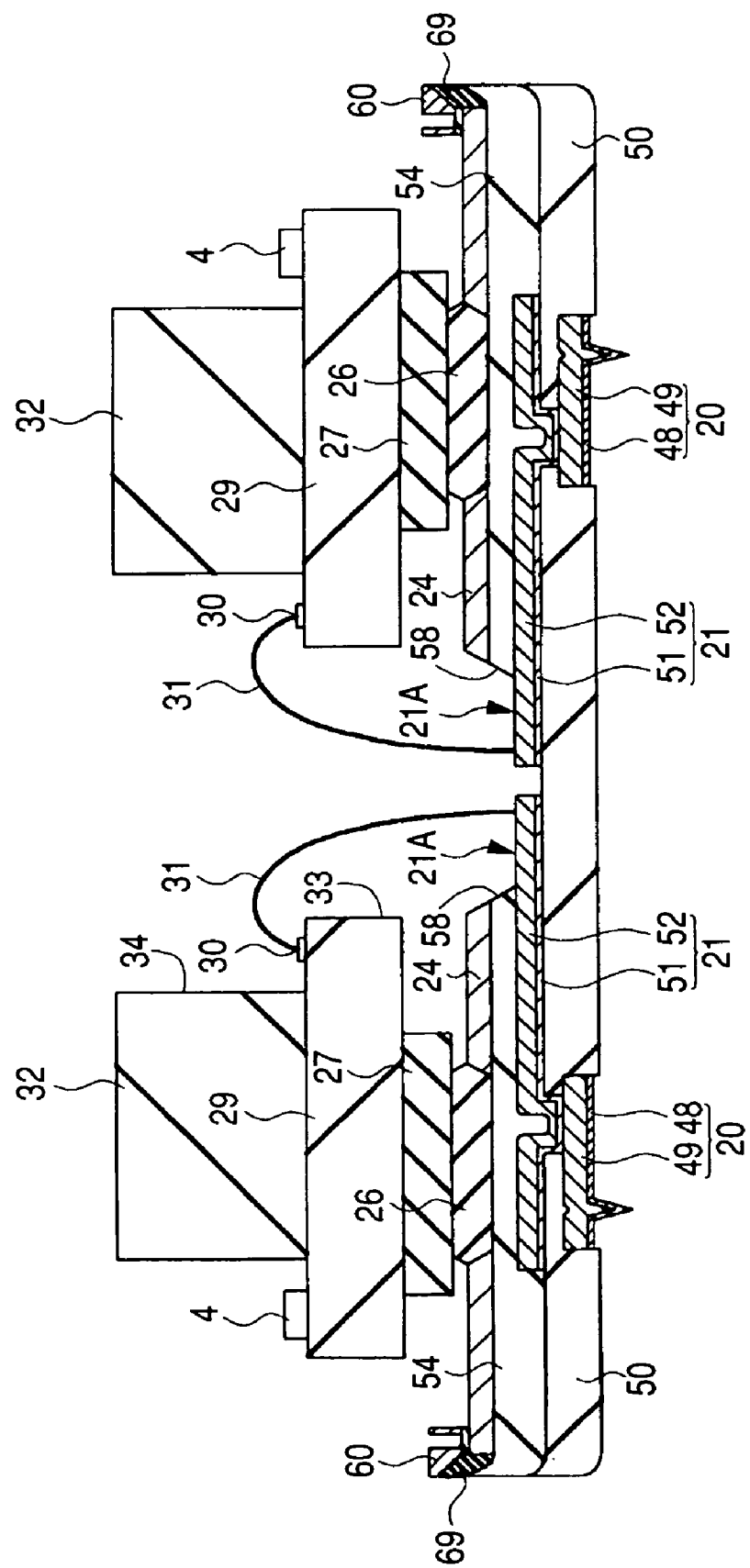
FIG. 17 is a section view showing the step following the step shown in FIG. 16 in the fabrication of thin film probes.

Next, as shown in FIG. 17, an adhesive 69 is applied between the thin film probe frame 60 and the polyimide film 23. Then, the tips of the thin film probe frame 60 are fastened to the deformed polyimide film 23 while the thin film probe frame 60 is thrust downward.

After that, the protective films 66 and 67, and the polyimide films 22 and 23 and the adhesive 69, integrated with the thin film probe frame 60 along its outer circumference, are cut out to fabricate the thin film probes 20 for this Embodiment 1.

Figure 36:
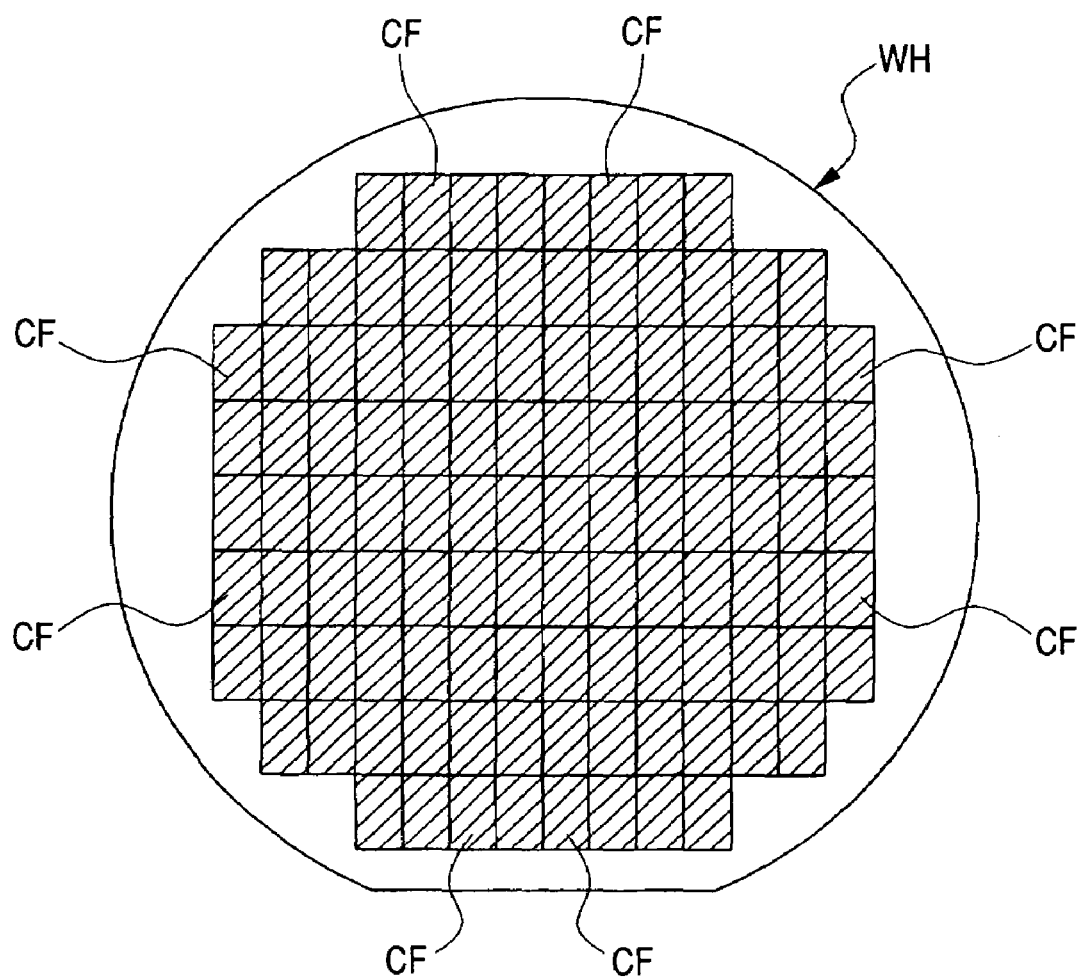
FIG. 36 is a plan of a semiconductor wafer having semiconductor chip areas to be probed by use of a probe card, which represent Embodiment 1 of the invention.

FIG. 36 is a plan view of a wafer WH in which a plurality of chips (chip areas) CF are partitioned. Probing by the use of the probe card of this Embodiment 1 is performed on the wafer WH, which is partitioned into the plurality of chips CF. In order to enhance the throughput of inspection (e.g. probing) of semiconductor integrated circuits in a wafer state, the length of time the inspection requires per wafer should be shortened. The time T0 required for inspection per wafer is represented by $T0=(T1+T2)\times N+T3$, for instance, where T1 is the time taken by the semiconductor inspection apparatus per round of inspection; T2 is the time taken to index the probe card; N is the number of touch-downs of bringing the probes the prober has (the probes 20 in this Embodiment 1 (see FIG. 4)) into contact with the wafer; and T3 is the time taken to replace the wafer. This equation reveals that, in order to enhance the throughput of inspection of the semiconductor integrated circuit device in a wafer state, the number of touch-downs should be reduced. On the other hand, the shot efficiency K is represented by $K=M1/(M2\times N)$ where M1 is the number of chip areas formed in one wafer, and M2 is the number of chip areas the probe card can come into contact with. That this shot efficiency K is poor means that the efficiency of the use of the probe card is poor and the number of touch-downs is increased. Thus, this equation representing the shot efficiency K also reveals the need to reduce the number of touch-downs.

Hereupon, various examples of multiple chip simultaneous testing (including ultra-multiple chip simultaneous testing) of chip areas in the inspection of semiconductor integrated circuits in a wafer state and the shot efficiencies in these examples will be described with reference to FIG. 18 through FIG. 25.

Figure 18:
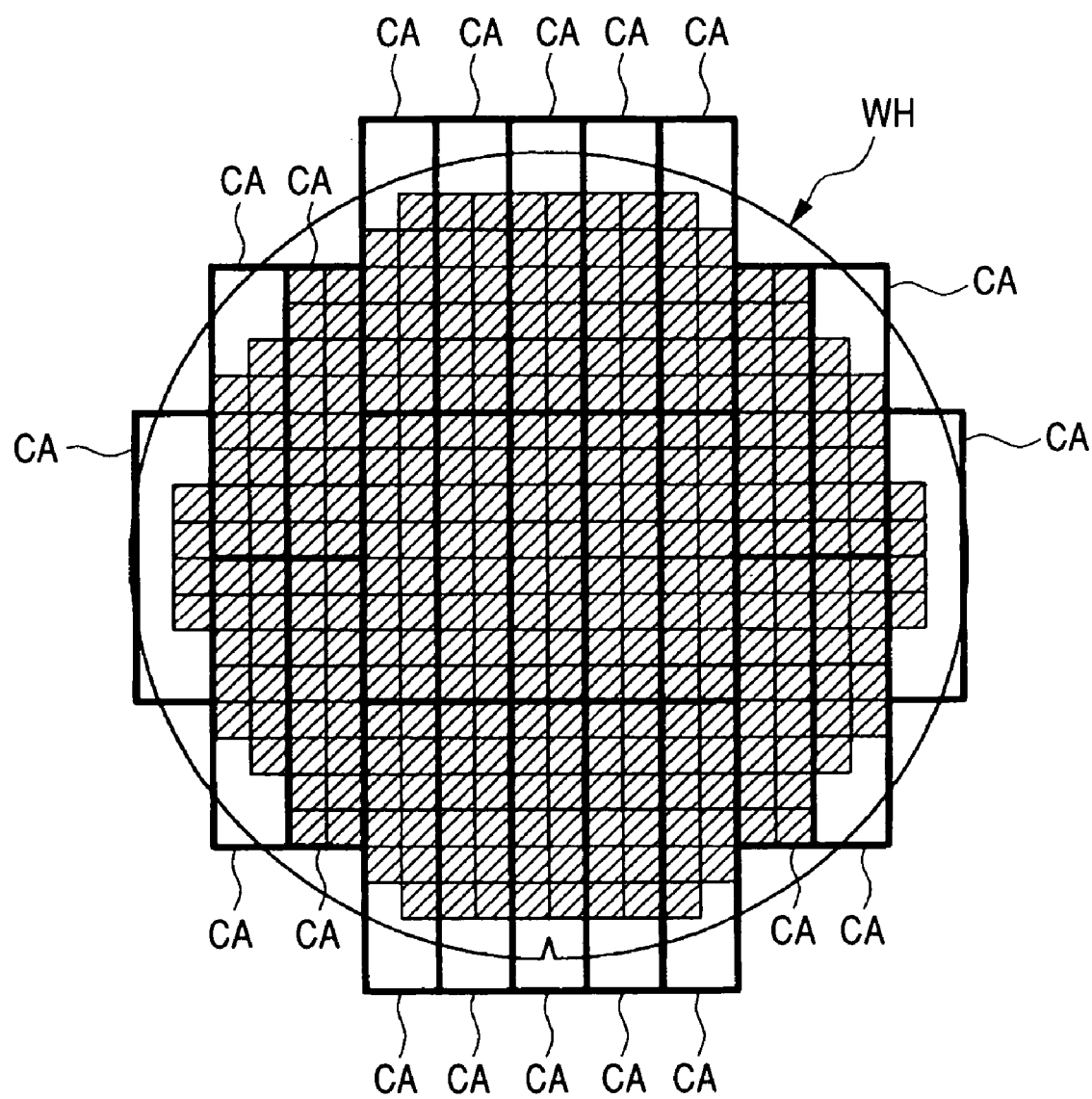
FIG. 18 is a plan view showing one example of the arrangement of chip areas in a wafer face to be inspected with a semiconductor inspection apparatus per contact of the probe card.

FIG. 18 is a plan view showing an example of the arrangement of chip areas in a wafer face to be inspected with a semiconductor inspection apparatus per contact of the probe card. The chip areas are hatched in the drawing.

In the example shown in FIG. 18, 312 chip areas are partitioned in the wafer WH. Each of the contact areas CA the probe card can come into contact with at a time is matched with a total of 16 chip areas consisting of two in the lateral direction of the drawing by eight in the vertical section, so that the probe card can inspect semiconductor integrated circuits in all the chip areas in the face of the wafer WH in 25 contacts. The above-cited equation to calculate the shot efficiency K reveals that the shot efficiency in this case is about 78%.

Figure 19:
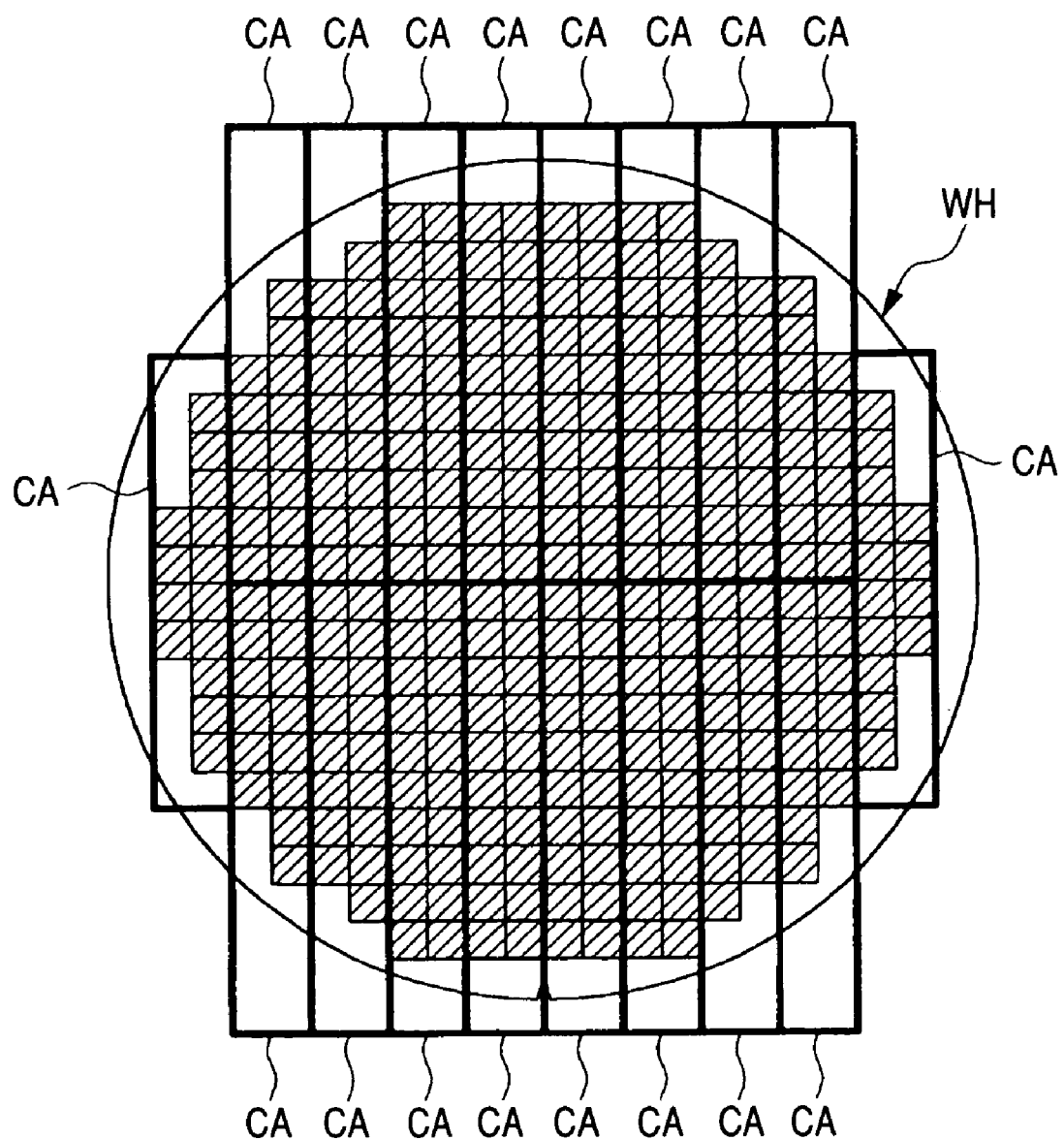
FIG. 19 is a plan view showing another example of the arrangement of chip areas in a wafer face to be inspected with a semiconductor inspection apparatus per contact of the probe card.

FIG. 19 is a plan view showing another example of the arrangement of chip areas in a wafer face to be inspected with a semiconductor inspection apparatus per contact of the probe card. The chip areas are hatched in the drawing.

In the example shown in FIG. 19, 312 chip areas are partitioned in the wafer WH. Each of the contact areas CA the probe card can come into contact with at a time is matched with a total of 24 chip areas consisting of two in the lateral direction of the drawing by 12 in the vertical section, so that the probe card can inspect semiconductor integrated circuits in all the chip areas in the face of the wafer WH in 18 contacts. The above-cited equation to calculate the shot efficiency K reveals that the shot efficiency in this case is about 72%.

Figure 20:
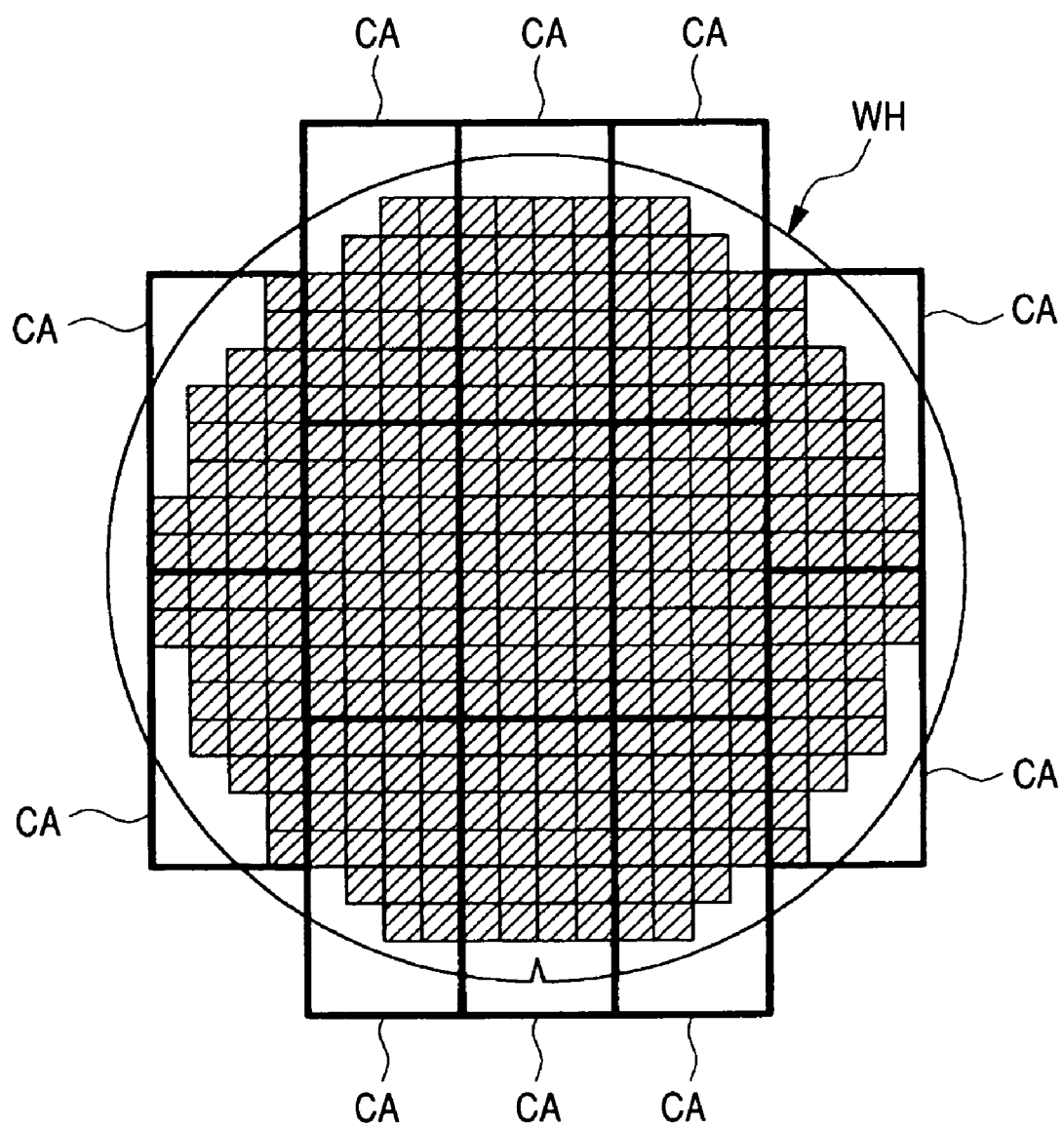
FIG. 20 is a plan view showing another example of the arrangement of chip areas in a wafer face to be inspected with a semiconductor inspection apparatus per contact of the probe card.

FIG. 20 is a plan view showing another example of the arrangement of chip areas in a wafer face to be inspected with a semiconductor inspection apparatus per contact of the probe card. The chip areas are hatched in the drawing.

In the example shown in FIG. 20, 312 chip areas are partitioned in the wafer WH. Each of the contact areas CA the probe card can come into contact with at a time is matched with a total of 32 chip areas consisting of four in the lateral direction of the drawing by eight in the vertical section, so that the probe card can inspect semiconductor integrated circuits in all the chip areas in the face of the wafer WH in 13 contacts. The above-cited equation to calculate the shot efficiency K reveals that the shot efficiency in this case is about 75%.

Figure 21:
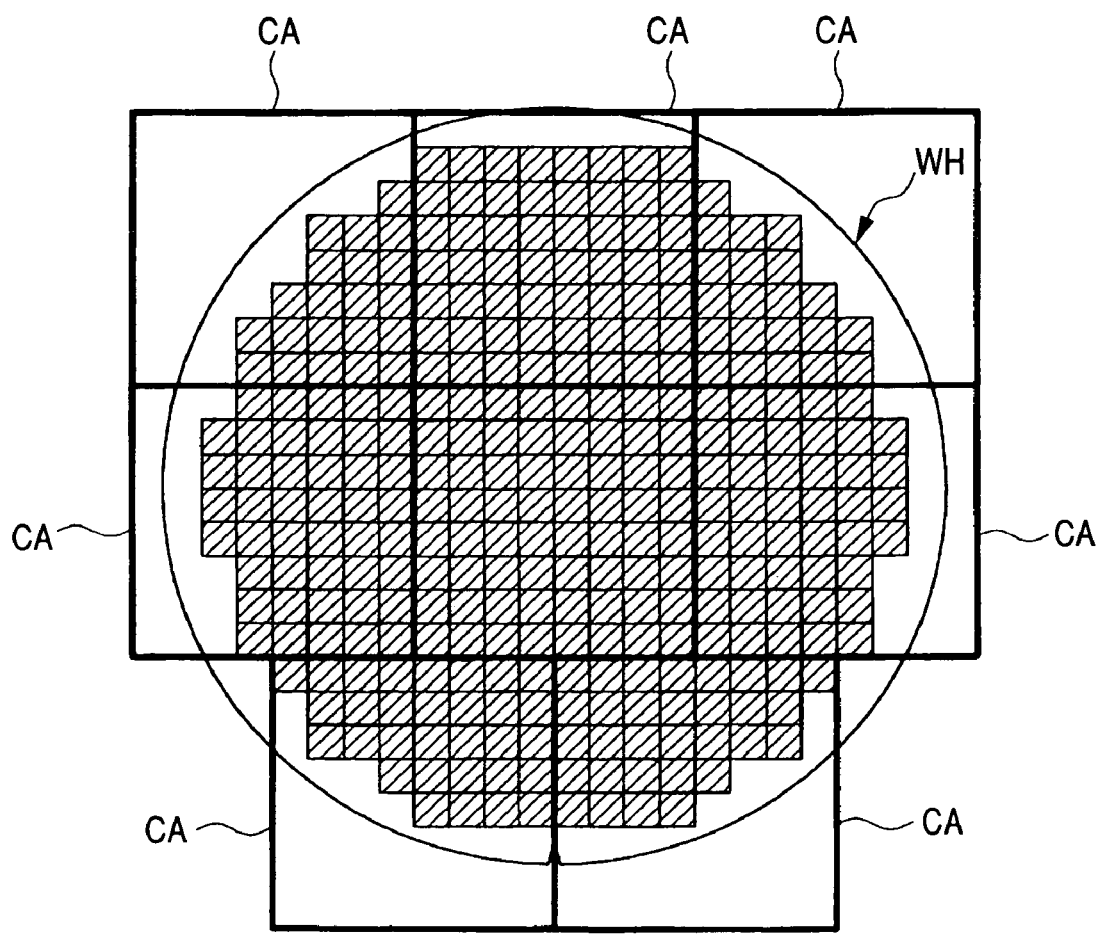
FIG. 21 is a plan view showing another example of the arrangement of chip areas in a wafer face to be inspected with a semiconductor inspection apparatus per contact of the probe card.

FIG. 21 is a plan view showing another example of the arrangement of chip areas in a wafer face to be inspected with a semiconductor inspection apparatus per contact of the probe card. The chip areas are hatched in the drawing.

In the example shown in FIG. 21, 312 chip areas are partitioned in the wafer WH. Each of the contact areas CA the probe card can come into contact with at a time is matched with a total of 64 chip areas consisting of eight in the lateral direction of the drawing by eight in the vertical section, so that the probe card can inspect semiconductor integrated circuits in all the chip areas in the face of the wafer WH in 8 contacts. The above-cited equation to calculate the shot efficiency K reveals that the shot efficiency in this case is about 61%.

Figure 22:
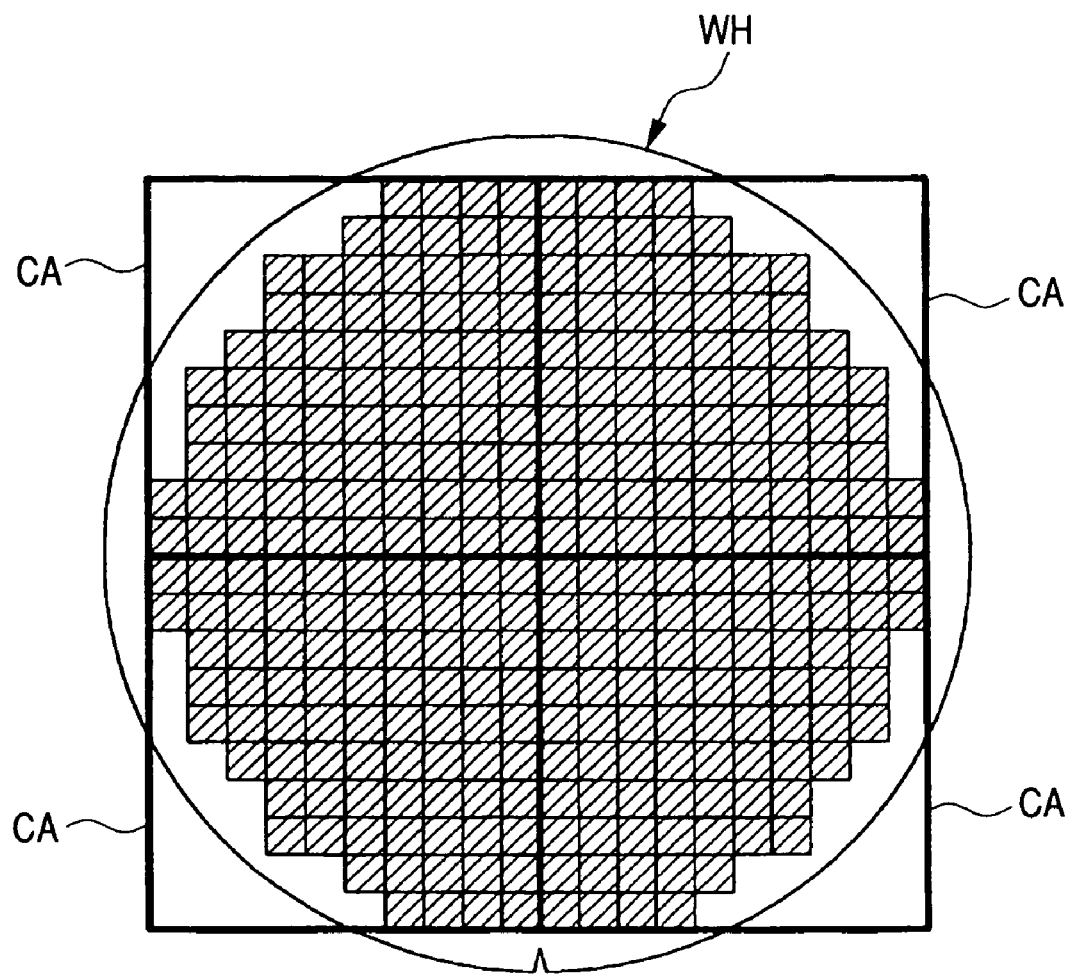
FIG. 22 is a plan view showing another example of the arrangement of chip areas in a wafer face to be inspected with a semiconductor inspection apparatus per contact of the probe card.

FIG. 22 is a plan view showing another example of the arrangement of chip areas in a wafer face to be inspected with a semiconductor inspection apparatus per contact of the probe card. The chip areas are hatched in the drawing.

In the example shown in FIG. 22, 312 chip areas are partitioned in the wafer WH. Each of the contact areas CA the probe card can come into contact with at a time is matched with a total of 100 chip areas consisting of 10 in the lateral direction of the drawing by 10 in the vertical section, so that the probe card can inspect semiconductor integrated circuits in all the chip areas in the face of the wafer WH in four contacts. The above-cited equation to calculate the shot efficiency K reveals that the shot efficiency in this case is about 78%.

Figure 23:
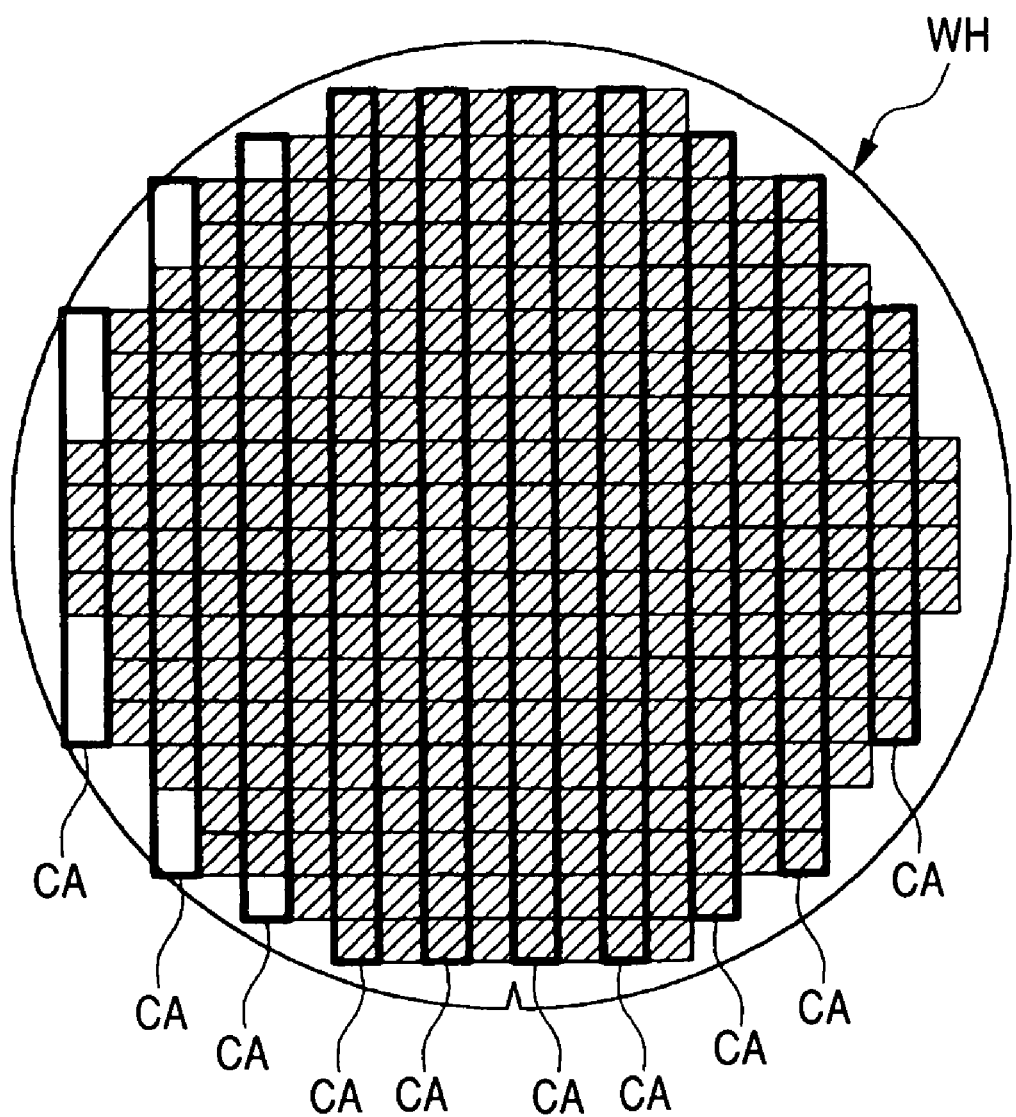
FIG. 23 is a plan view showing another example of the arrangement of chip areas in a wafer face to be inspected with a semiconductor inspection apparatus per contact of the probe card.

FIG. 23 is a plan view showing another example of the arrangement of chip areas in a wafer face to be inspected with a semiconductor inspection apparatus per contact of the probe card. The chip areas are hatched in the drawing.

In the example shown in FIG. 23, 312 chip areas are partitioned in the wafer WH. Each of the contact areas CA the probe card (the probes 20) can come into contact with at a time is matched with every other row of chip areas, so that the probe card can inspect semiconductor integrated circuits in all the chip areas in the face of the wafer WH in two contacts. In this case, the number of chip areas the probe card can come into contact with at a time is 168. The above-cited equation to calculate the shot efficiency K reveals that the shot efficiency in this case is about 93%.

Figure 24:
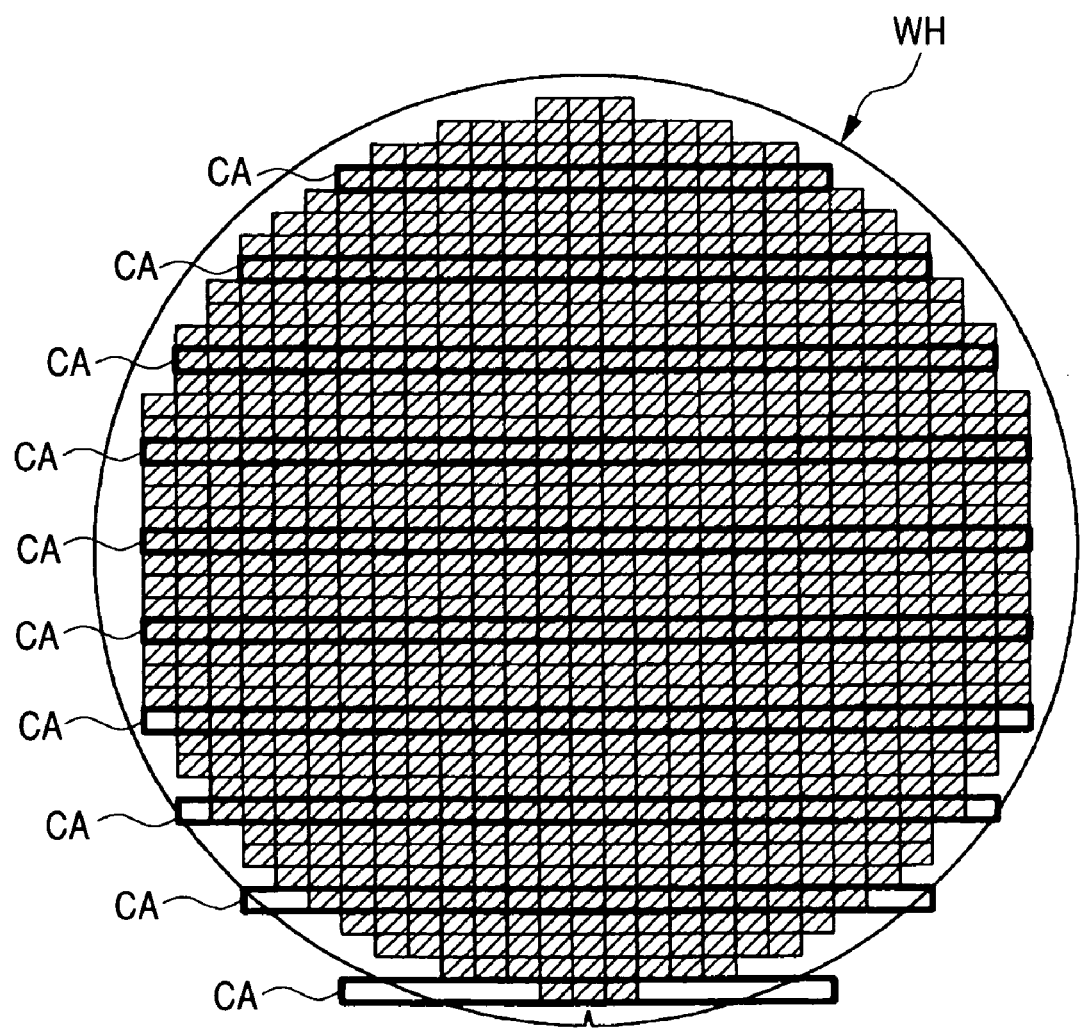
FIG. 24 is a plan view showing another example of the arrangement of chip areas in a wafer face to be inspected with a semiconductor inspection apparatus per contact of the probe card.

FIG. 24 is a plan view showing another example of the arrangement of chip areas in a wafer face to be inspected with a semiconductor inspection apparatus per contact of the probe card of this Embodiment 1. The chip areas are hatched in the drawing.

In the example shown in FIG. 24, 856 chip areas are partitioned in the wafer WH. Each of the contact areas CA the probe card (the probes 20) can come into contact with at a time is matched with every fourth row of chip areas, so that the probe card can inspect semiconductor integrated circuits in all the chip areas in the face of the wafer WH in four contacts. In this case, the number of chip areas the probe card can come into contact with at a time is 230. The above-cited equation to calculate the shot efficiency K reveals that the shot efficiency in this case is about 93%.

Figure 25:
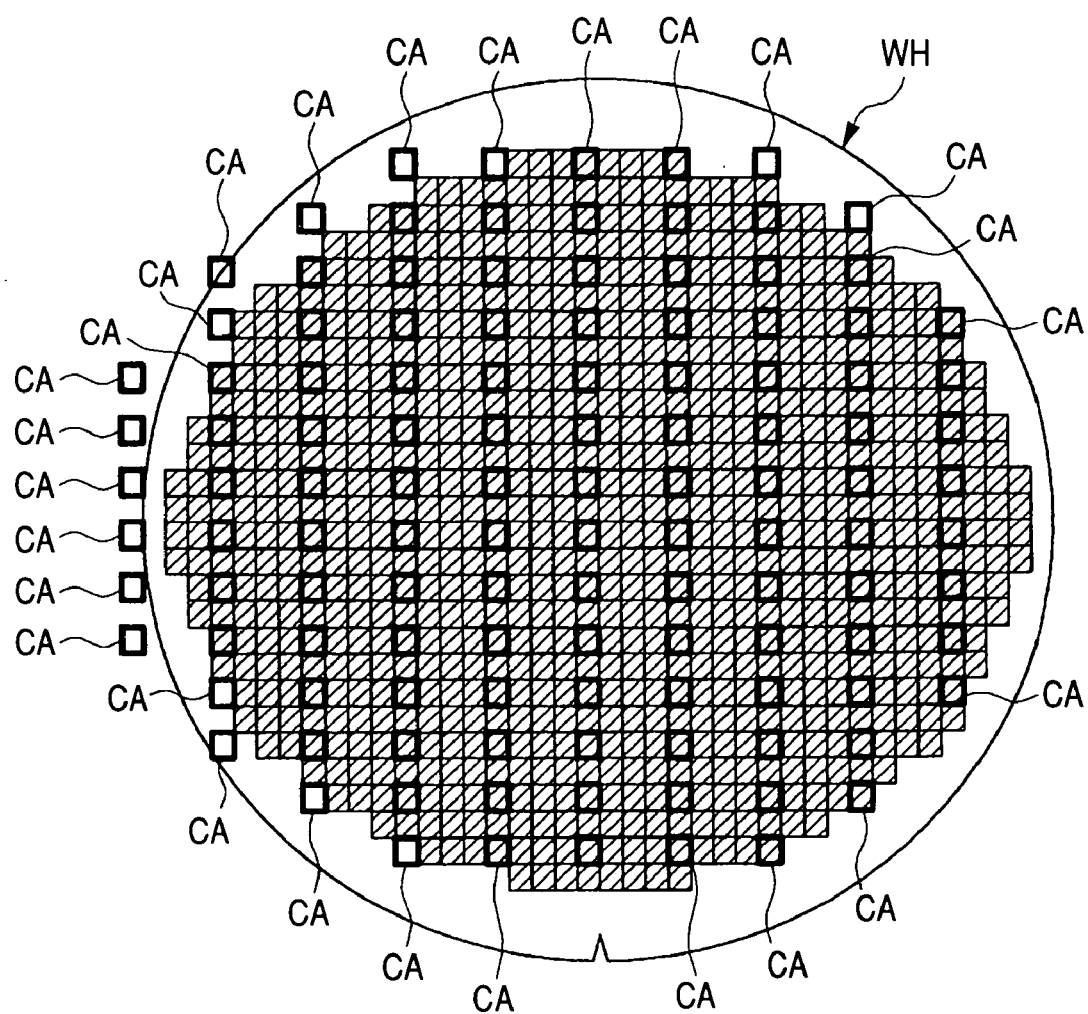
FIG. 25 is a plan view showing of another example of the arrangement of chip areas in a wafer face to be inspected with a semiconductor inspection apparatus per contact of the probe card.

FIG. 25 is a plan view showing another example of the arrangement of chip areas in a wafer face to be inspected with a semiconductor inspection apparatus per contact of the probe card of this Embodiment 1. The chip areas are hatched in the drawing.

In the example shown in FIG. 25, 828 chip areas are partitioned in the wafer WH. Each of the contact areas CA the probe card (the probes 20) can come into contact with at a time is matched with one or another of prescribed chip areas selected at equal intervals, so that the probe card can inspect semiconductor integrated circuits in all the chip areas in the face of the wafer WH in eight contacts. In this case, the number of chip areas the probe card can come into contact with at a time is 118. The above-cited equation to calculate the shot efficiency K reveals that the shot efficiency in this case is about 88%.

As described with reference to FIG. 18 through FIG. 25, where rectangular contact areas CA are set as shown in FIG. 18 through FIG. 22, the shot efficiency is less than about 80%, but where the contact areas CA are set by selecting chip areas in a prescribed arrangement or at prescribed intervals all over the wafer WH, as shown in FIG. 23 through FIG. 25, the shot efficiency can be raised to about 80% or above. In terms of the number of touch-downs in these cases, in the cases shown in FIG. 23 through FIG. 25, the number can be much less than in the cases where rectangular contact areas CA are set (except the cases shown in FIG. 21 and FIG. 22). Thus, the length of time taken by inspection per wafer can be reduced by selecting chip areas in a prescribed arrangement or at prescribed intervals all over the wafer WH, as shown in FIG. 23 through FIG. 25, and setting the contact areas CA on that basis. As a result, the throughput of inspection of semiconductor integrated circuits in a wafer state can be enhanced.

Or, where cantilevered probe needles are used, it is feared that the erection of probe needles on the probe card may become difficult if the chip areas are reduced in size and the pitch of the electrodes (test pads) in the chip areas is narrowed. Furthermore, where cantilevered probe needles are used, if two rows of electrodes (test pads) formed in the chip areas are arrayed along two opposite sides, i.e. one row per side, for instance, needle erection matching the contact areas CA of two rows of chip areas shown in FIG. 18 and FIG. 19 will be possible. However, if more rows of chip areas become the contact areas CA (for instance as in the cases shown in FIG. 20 through FIG. 22) or chip areas selected in a prescribed arrangement or at prescribed intervals all over the wafer WH are set as the contact areas CA (for instance as in the cases shown in FIG. 23 through FIG. 25), needle erection will be impossible if the extending direction of the probe needles is taken into consideration. Thus, the use of cantilevered probe needles would make it impossible to realize a case of multiple chip simultaneous testing as shown in FIG. 23 through FIG. 25, in which the shot efficiency would be high and the number of touch-downs would be small. On the other hand, the probe card of this Embodiment 1 described with reference to FIG. 1 through FIG. 17, since it allows the tips of the probes 20 (see FIG. 4) to be so arranged as to match the electrodes (test pads) all over the main face of the wafer to be inspected WH as described above, can realize a case of multiple chip simultaneous testing as shown in FIG. 23 through FIG. 25. It is also possible, if the tips of the probes 20 are arranged to match the positions of all of the electrodes (test pads) in all the chip areas formed in the wafer to be inspected WH, to reduce the number of touch-downs to only one.

Figure 26:
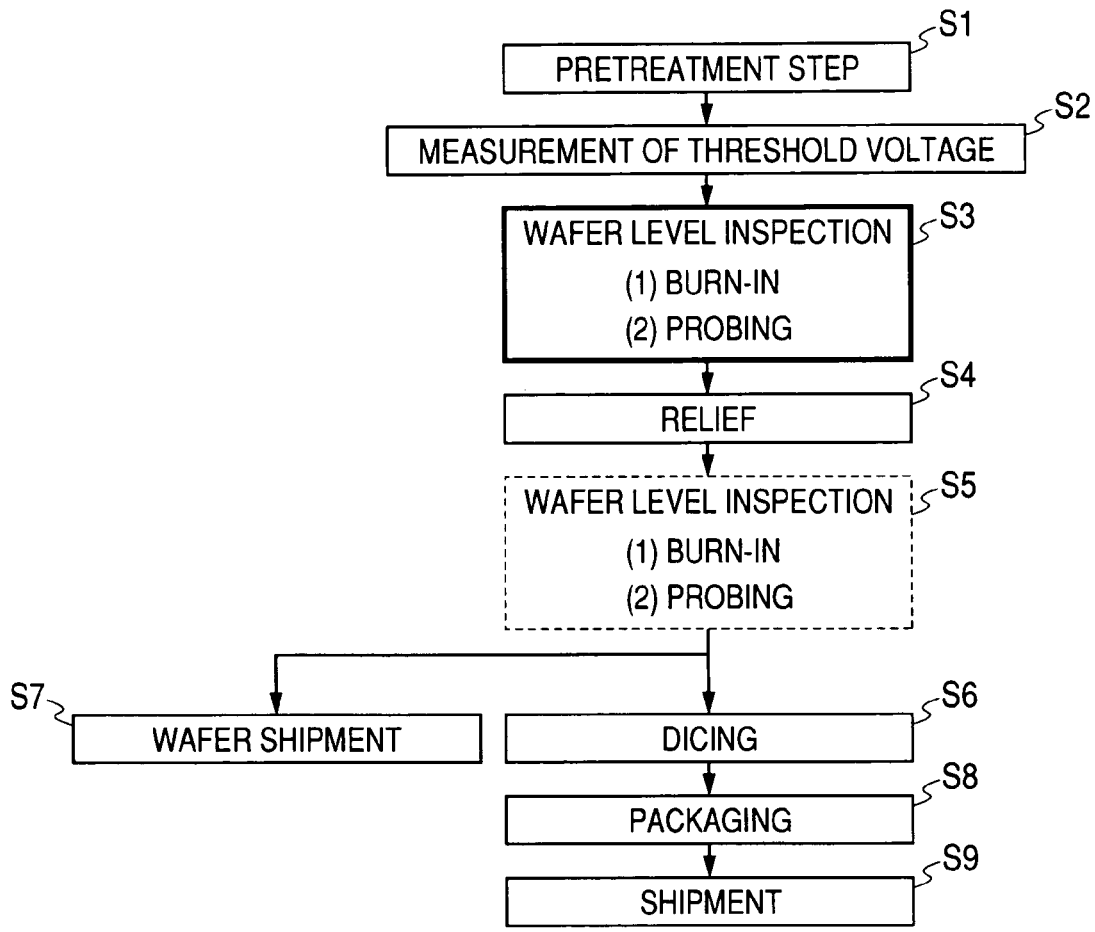
FIG. 26 is a flowchart of a fabrication process for semiconductor integrated circuit devices representing one mode of implementing the invention.

Next, one example of a method of fabrication of semiconductor integrated circuit devices according to this Embodiment 1 will be described with reference to FIG. 26. FIG. 26 is a flowchart of the fabrication process for semiconductor integrated circuit devices. The following description refers to a case in which this Embodiment 1 uses as a semiconductor integrated circuit device a multi-chip package (MCP) in which a logic IC and an electrically erasable programmable read only memory (EEPROM; hereinafter referred to as flash memory) are mounted in mixture.

First, at a pretreatment step, many elements constituting each of a logic IC and a flash memory are formed over the device face (main face) of a wafer. Thus, at this step, on the basis of the respective specifications of the logic IC and the flash memory, a desired integrated circuit is formed by repeating on a semiconductor wafer consisting of single crystal silicon, for instance, such wafer processing steps as oxidation, diffusion, doping, wiring pattern formation, and the formation of insulating layers and wiring layers (step S1). Also, in each of the chip areas partitioned in the device face (main face) of the wafer, a built-in self test (BIST) circuit for use in probing is formed then. In this Embodiment 1, this BIST circuit is used for probing the flash memory part.

Then, MISs constituting a test element group (TEG) formed in a scribe area for dividing the wafer into a plurality of chip areas are put to a DC operation characteristics test. Thus, the threshold voltages of the MISs constituting each of the logic IC and the flash memory are checked by measuring the threshold voltages of the MISs constituting the TEG (step S2).

Next, the wafer in which many elements are formed is inspected (wafer level inspection) (step S3). In this inspection, burn-in and probing are performed in that sequence, and simple probing may be added before burn-in, as required. In burn-in, a current is caused to flow into the integrated circuit by applying the rated or a higher source voltage to the wafer in an ambience of high temperature (e.g. 125° C. to 150° C.) to screen out chips that may prove detective in the future when temperature and voltage stresses are applied. Probing includes, for instance, a functional test to check whether or not the prescribed function is performed by use of a prescribed test pattern, an open/short test between input and output terminals, a leakage current test, a DC test of measuring the source current, and an AC test on the AC timing. At this wafer level probing step, a semiconductor inspection apparatus having the probe card of this Embodiment 1, as described with reference to FIG. 1 through FIG. 17, is used. Also at the wafer level burn-in step, the probe card of this Embodiment 1 can be applied. Such inspection at the wafer level makes it possible to feed back defect data in burn-in and other tests to the pretreatment step. Thus, any trouble at the pretreatment step can be fixed.

Figure 27:
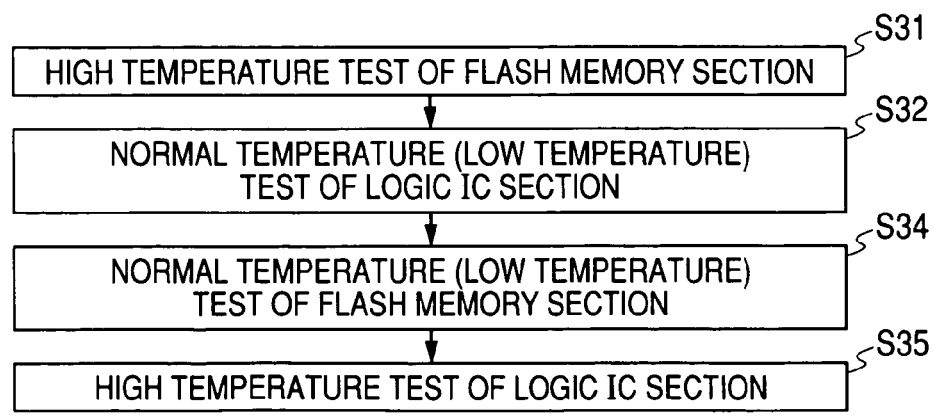
FIG. 27 is a flowchart of details of the probing step shown in the flowchart of FIG. 26.

FIG. 27 is a flowchart showing of details of the probing process described above. As shown in FIG. 27, first the flash memory part is probed in an ambience of high temperature (e.g. 80° C. to 150° C.) (step S31). At this step, probing is advanced in accordance with the multiple chip simultaneous testing of chip areas described with reference to FIG. 18 through FIG. 25 by use of the BIST circuit and the probe card of this Embodiment 1, as described with reference to FIG. 1 through FIG. 17.

Then, the logic IC part is probed in an ambience of normal temperature (e.g. about 20° C. to 30° C.) or an ambience of low temperature (e.g. about −40° C.) (step S32). In the example of the process for this Embodiment 1, the BIST circuit is not used for this probing of the logic IC part, and no multiple chip simultaneous testing is applied to chip areas, but each individual chip area is probed. For the logic IC, since the number of the test pads is very large, no multiple chip simultaneous testing is applied to chip areas either, but probing is advanced by use of the probe card of this Embodiment 1 having the thin film probe 3 (FIG. 3 and see FIG. 4) in which each of the probes 20 matches one or another of the chip areas (see FIG. 6).

Next, the flash memory part is probed in an ambience of normal temperature (e.g. about 20° C. to 30° C.) or an ambience of low temperature (e.g. about −40° C.) (step S33). At this step, probing can be performed by use of the BIST circuit and the probe card used at step S31.

Then, the logic IC part is probed in an ambience of high temperature (e.g. 80° C. to 150° C.) (step S34). At this step, probing can be performed by use of the probe card used at step S32.

At step S3 described above, tests taking a long time like the burn-in time (about 8 to 48 hours), such as a long cycle test or a refresh test (about one to tens of hours), may as well be performed. By performing such time-consuming tests at the wafer level, the throughput of the fabrication of semiconductor integrated circuit devices of this Embodiment 1 can be significantly enhanced over the case of conducting such tests after the wafer is divided into individual chips.

Next, elements found defective as a result of the burn-in and probing described above are relieved by irradiation with a laser beam. Thus, at this step, for instance, the result of probing is analyzed, any defective bit of the flash memory is found, and redundancy relief is processed to repair the defective bit by cutting the fuse of the redundancy relief bit with a laser beam or cutting an electrical fuse with an external voltage input (step S4). After this relief step, a wafer level burn-in step and a wafer level probing step respectively similar to the wafer level burn-in step and the wafer level probing step employed at step S3 described above may as well be performed. This step is intended to confirm that the redundancy relief has changed the defective bit to a redundancy relief bit. Hereupon, an interference test of memory cells in the flash memory, which can only be conducted after redundancy relief, such as a disturb refresh test, may be performed as well. Or, memory cells in the flash memory may be put to write and erase tests at the wafer level (step S5).

Next, the wafer in which logic ICs and flash memories are formed is cut into individual chips (step S6). It is also possible to ship the wafer as it is as a good product without cutting it into chips (step S7).

Then, after going through a die bonding step at which chips in which logic ICs and flash memories are formed are mounted on a package substrate, a wire bonding step at which pads of each chip and pads on the package substrate are electrically connected with wires, a resin molding step at which the individual chip and wire parts are resin-molded for protection, and a lead molding step of molding and surface-treating external leads, the chips are packaged (step S8). Incidentally, wire bonding is not the only applicable way here, but flip chip bonding is also acceptable. A package assembled in this way is shipped as a product, which is made available to users (step S9).

In the above-described fabrication process for the semiconductor integrated circuit device of this Embodiment 1, as it includes burn-in and probing before the package assembly, chips found defective as a result of burn-in or probing can be relieved. As this enables packages to be assembled by KGD, the yield of the packages can be significantly enhanced.

Also, the application of burn-in and probing at the wafer level helps reduce the total index time. Furthermore, inspection at the wafer level serves to increase the number of chips that can be inspected at the same time. As these factors enable the throughput of the wafer inspection procedure to be enhanced, the production cost of semiconductor integrated circuit devices of this Embodiment 1 can be reduced.

Embodiment 2

Next, an Embodiment 2 of the invention will be described.

Figure 28:
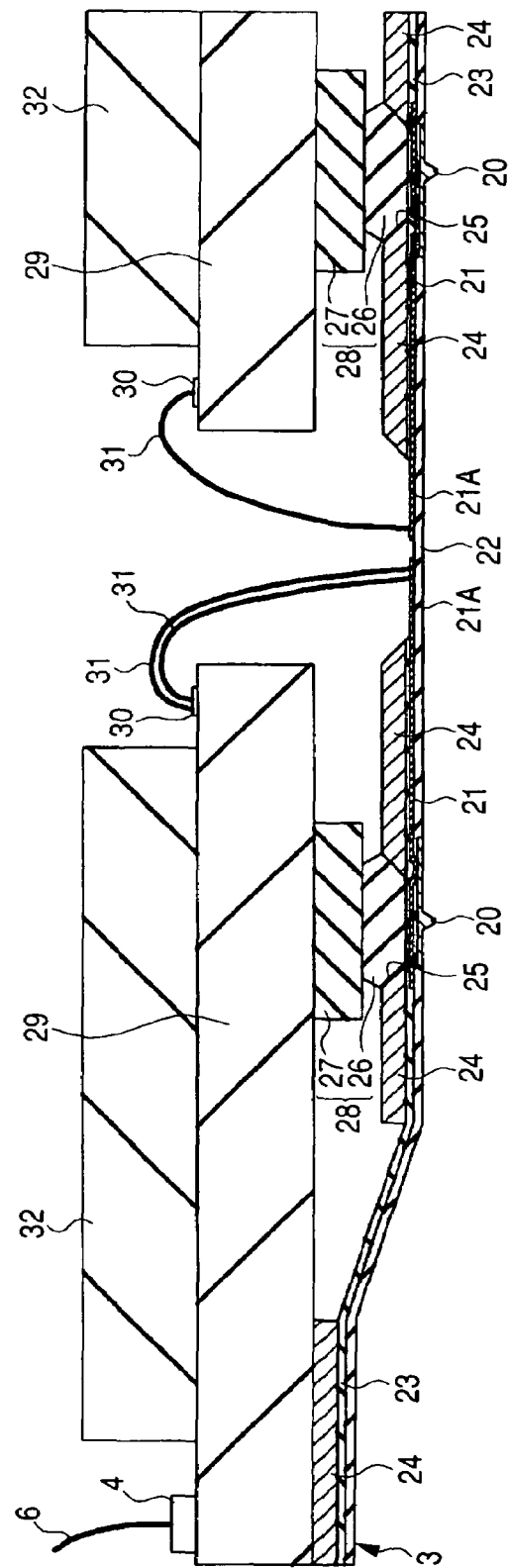
FIG. 28 is an enlarged section view of part of a thin film probe contained in a probe card, which represents Embodiment 2 of the invention.

Among the electrodes (test pads) formed on the main face of the wafer to be inspected, there are some through which relatively large currents flow, including for instance power supply wiring and ground wiring. In this Embodiment 2, as shown in FIG. 28, a plurality of wires 31 are bonded between the bonding pads 21A electrically connected to the probes 20 which come into contact with such electrodes (test pads) and the pads 30. The current capacity between the bonding pads 21A and the pads 30, in which relatively large currents flow, can be enlarged.

Figure 29:
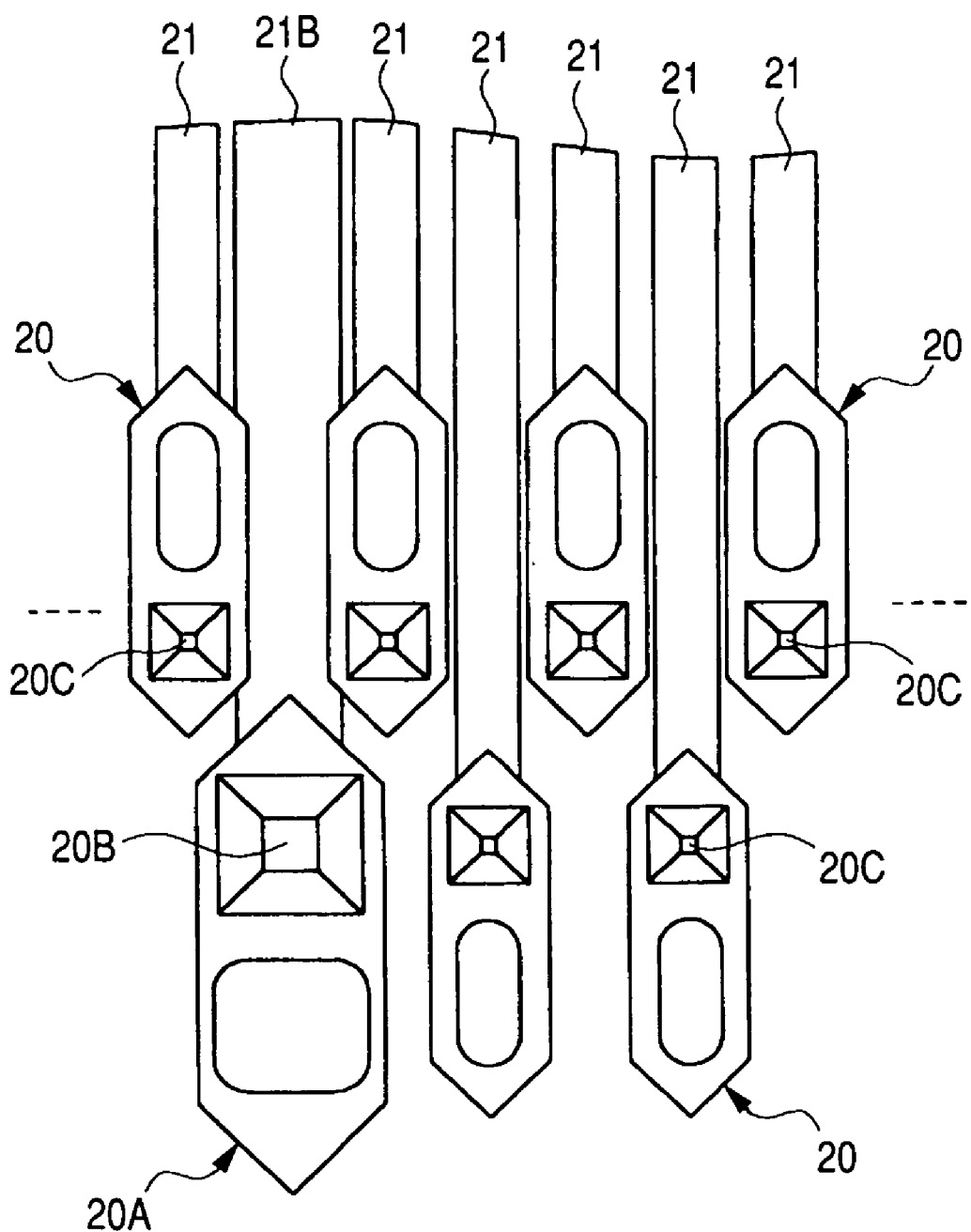
FIG. 29 is a plan view showing a representative part of the thin film probe contained in a probe card, which represents Embodiment 2 of the invention.

The electrical load on the probes 20 in contact with the electrodes (test pads) in which relatively large currents flow, if formed in the same size as other probes 20, will also be greater. If this electrical load is greater, there may arise such troubles that those probes 20 are heated and welded onto the electrodes (test pads) or are broken. In view of this fear, in this Embodiment 2, probes (contact terminals) 20A opposite the electrodes (test pads) in which relatively large currents flow are provided with tips 20B whose size is greater in relative terms, as shown in FIG. 29. The probes 20A and wires 21B, which are electrically connected to the probes 20A, are also formed so as to be greater in width than the probes 20 and the wires 21, respectively. Since a thin natural oxide film is formed over the electrodes (test pads), the tips 20B will break that natural oxide film so as to be in electrical contact with the electrodes (test pads) sideways. Since the electrical contact area of those greater tips 20B can be made greater than that of the smaller tips 20C by providing the tips 20B, which are greater in size in relative terms than the tips 20C of the probes 20, the contact resistance between the electrodes (test pads), in which relatively large currents flow, and the tips 20B can be reduced. It is preferable for the ratio of the electrical contact area of the tips 20B to that of the tips 20C to be greater than the ratio of the amperage of the currents flowing through the relatively greater tips 20B to that of the currents flowing through the relatively smaller tips 20C.

Where the tips 20B, which are greater in relative size, are formed as described above, the probes 20 and 20A are so formed as to equalize the height of the relatively greater tips 20B and that of the relatively smaller tips 20C. This equality in height enables all the probes 20 and 20A to be brought into secure contact with the electrodes (test pads).

Figure 30:
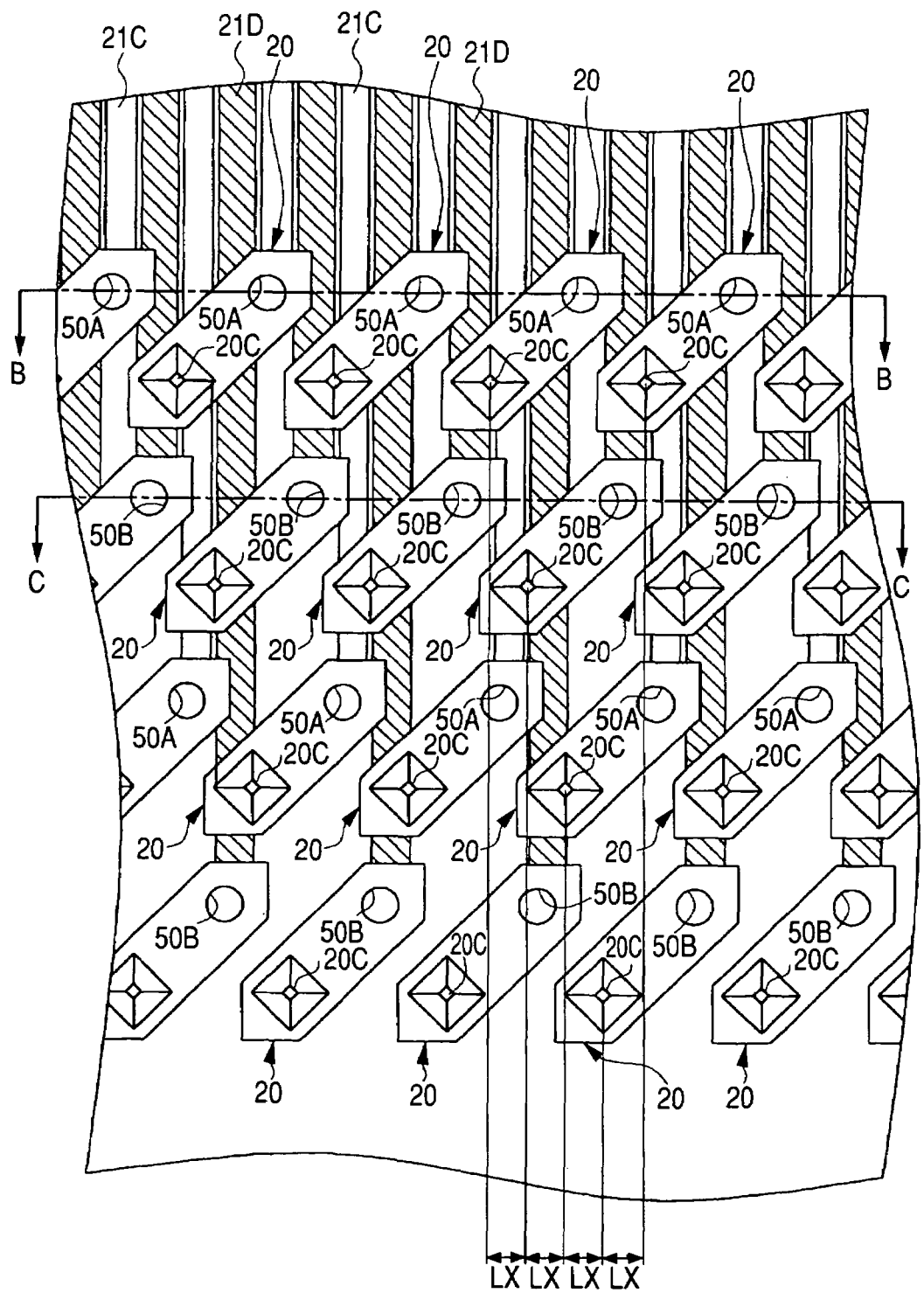
FIG. 30 is an enlarged plan view of part of the thin film probe contained in the probe card, which represents Embodiment 2 of the invention.
Figure 31:
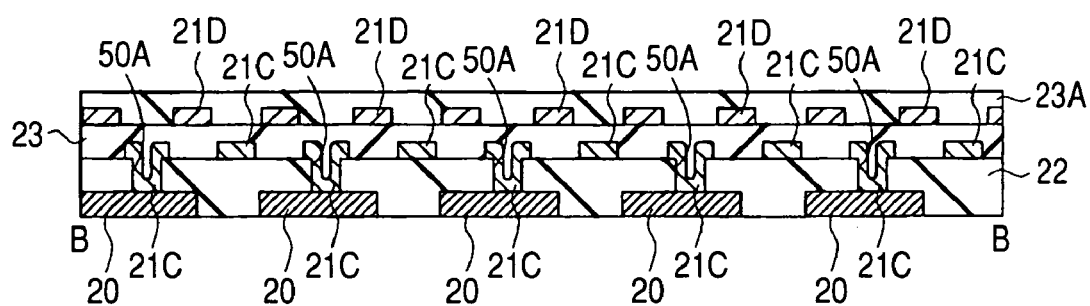
FIG. 31 is a section view taken along line B-B in FIG. 30.
Figure 32:
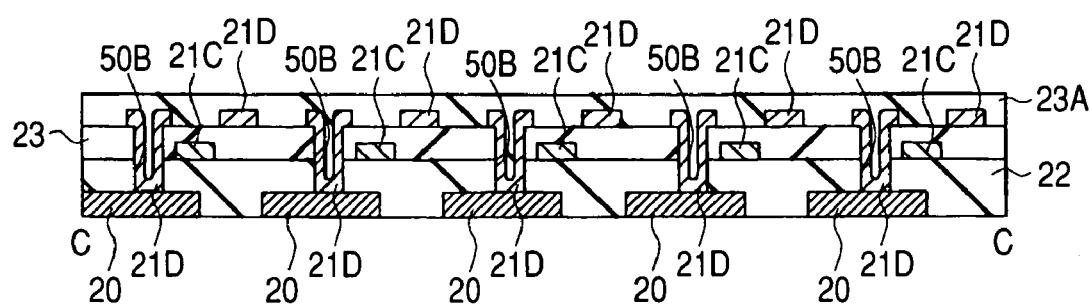
FIG. 32 is a section view taken along line C-C in FIG. 30.

Incidentally, where a large number of the electrodes (test pads) are arranged, those electrodes (test pads) may be arrayed in a plurality of rows. FIG. 30 is a plan view showing the essential part of the thin film probe 3 matching the electrodes (test pads) arrayed in four rows. FIG. 31 shows a section taken along line B-B in FIG. 30, and FIG. 32 shows a section taken along line C-C in FIG. 30. If the chip areas are equal in size, the distance LX between the tips 20C of adjoining probes 20 will narrow along with an increase in the number of arrays of the electrodes (test pads), and it is further feared that adjoining probes 20 may come into contact with each other. In view of this fear, by turning the planar hexagonal pattern of the probes 20 by 45° for instance, as shown in FIG. 30, it is possible to prevent the problem of adjoining probes 20 coming into contact with each other. Although an example of turning the planar hexagonal pattern of the probes 20 by 45° is described here, the angle is not limited to 45°, but it can be turned in any other angle so long as the adjoining probes 20 can be prevented from coming into contact with each other.

On the other hand, where the probes 20 matching four rows of the electrodes (test pads) are arranged as shown in FIG. 30, it will be difficult to form in the same wiring layer all of the wires 21 to be electrically connected to the probes 20 from above. This is because the aforementioned narrowing of the distance LX invites the fear of adjoining probes 20 coming into contact with each other, and, moreover, the wires 21 electrically connected to the probes 20 may also come into contact with each other. The fear of the wires 21B coming into contact with the adjoining wires 21 becomes even greater where there are formed wires 21B whose width is greater to match the current capacity, as described above. In view of this fear, those wires can be formed in two wiring layers (the wires 21C and 21D), for instance, in this Embodiment 2, as shown in FIG. 31 and FIG. 32. Incidentally, a polyimide film 23A is formed over the wires 21D and the aforementioned polyimide film 23 (see also FIG. 9 through FIG. 17). The wires 21C formed in the lower of the two layers are in contact with the probes 20 at the bottom of through holes 50A bored in the polyimide film 22, and the wires 21D in the upper of the two layers are in contact with the probes 20 at the bottom of through holes 50B bored in the polyimide film 23 and the polyimide film 22. As this arrangement makes it possible to secure a large enough spacing between adjoining wires 21C or wires 21D in the same wiring layer, the problem of adjoining wires 21C or wires 21D coming into contact with each other can be prevented. Or, where the electrodes (test pads) are arrayed in five or more rows and the number of the matching probe increases to narrow the aforementioned distance LX, the spacing between wires can be widened by forming a still greater number of wiring layers.

Embodiment 3

Now, an Embodiment 3 of the invention will be described.

Figure 33:
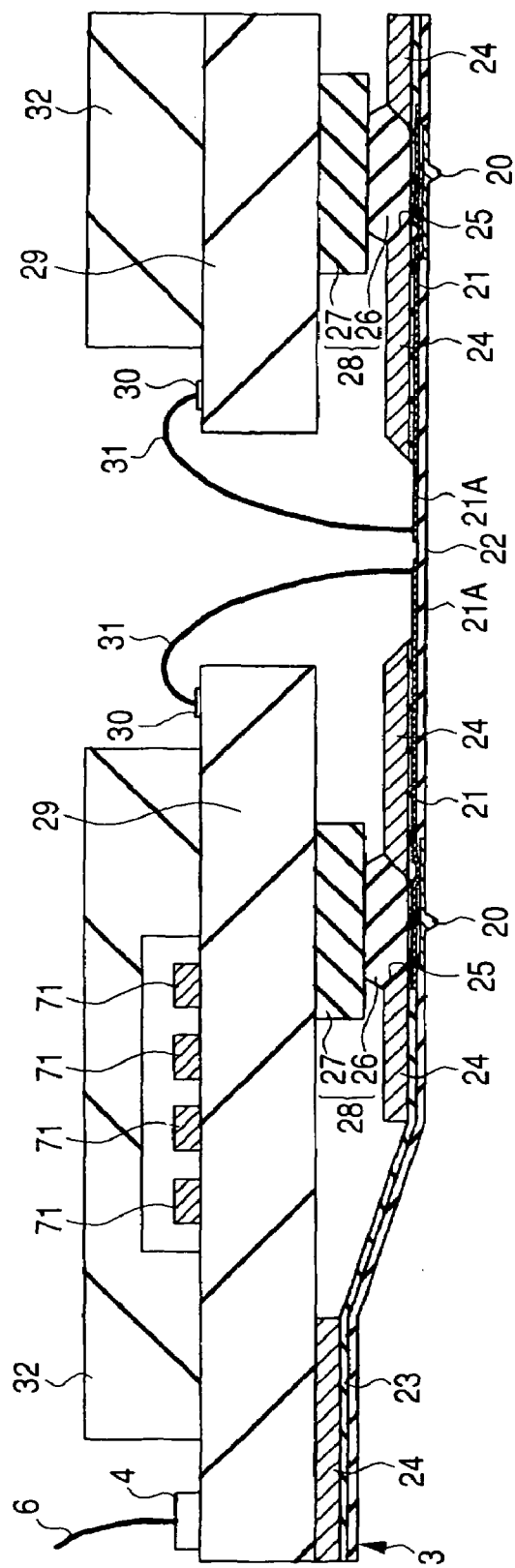
FIG. 33 is an enlarged section view of a representative part of a thin film probe contained in a probe card, which represents Embodiment 3 of the invention.

As shown in FIG. 33, a probe card of this Embodiment 3 is configured by fitting, over the glass epoxy substrate 29 (see also FIG. 4) in the probe card of Embodiment 1, electronic elements 71 electrically connected to a circuit (wiring) formed within the glass epoxy substrate 29. Conceivable examples of the electronic elements 71 in this Embodiment 3 include elements that can constitute relays, capacitors and built-out self test (BOST) circuits (second circuits). The shorter these electronic elements 71 are in electrical distance from the probes 20, the better they will be able to transmit electrical characteristics, such as analog clocks. For this reason, the electronic elements 71 can achieve better electrical characteristics when they are fitted to the glass epoxy substrate 29 than when they are fitted to, for instance, the multi-layered wiring board 1 (see FIG. 1 and FIG. 2).

Where the electronic element 71 is a relay, its relaying action can electrically guide only those probes 20 required for desired probing to the multi-layered wiring board 1. Thus, the wires 31 are so bonded as to electrically connect all of the probes 20 and circuits (wires) in the glass epoxy substrate 29, and probes 20 not required for desired probing are electrically cut off by the relay from the multi-layered wiring board 1. For instance, in the probing (e.g. DC testing) of the logic IC part described above for Embodiment 1 with reference to FIG. 27, the probes 20 are brought into contact with all of the electrodes (test pads) in the chip areas. Therefore, the relay is caused to electrically connect all of the probes 20 to the multi-layered wiring board 1. Or, in the probing of the flash memory part described above for Embodiment 1 with reference to FIG. 27, since a BIST circuit is used, it is not necessary to bring the probes 20 into contact with all of the electrodes (test pads) in the chip areas. Therefore, those probes 20 not required for probing are cut off from the multi-layered wiring board 1 by use of the relay, and only the probes 20 required for probing are electrically connected to the multi-layered wiring board 1 by use of the relay. This makes it possible for the logic IC part and the flash memory part to be probed with a single probe card (the thin film probe 3) only by relaying actions. As a result, the probe card (the thin film probe 3) need not be replaced every time the logic IC part is probed and the flash memory part is probed, resulting in simplification of the probing process. Furthermore, the elimination of the need to replace the probe card (the thin film probe 3) every time the logic IC part is probed and the flash memory part is probed also enables the cost of the probe card to be reduced.

Embodiment 4

Next, an Embodiment 4 of the invention will be described.

Figure 34:
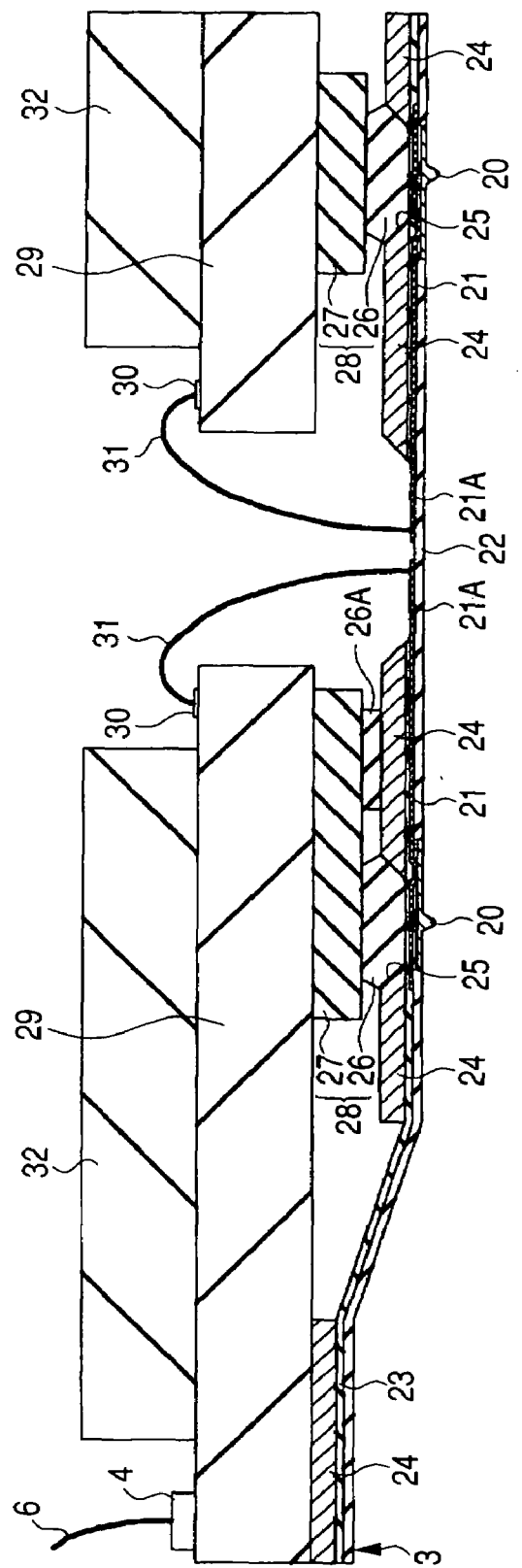
FIG. 34 is an enlarged section view of a representative part of a thin film probe contained in a probe card, which represents Embodiment 4 of the invention.

As shown in FIG. 34, a probe card of this Embodiment 4 has a configuration in which the elastomer 27 in the probe card of Embodiment 1 described above is extended toward the wires 31, and elastomer 26A, similar to the elastomer 26, is arranged between the extended part and the reinforcements 24. The arrangement of this elastomer 26A makes it possible to suppress the vibration of the glass epoxy substrate 29 when the wires 31 are bonded to the pads 30. As this suppression of the vibration of the glass epoxy substrate 29 prevents the energy applied when the wires 31 are bonded to the pads 30 from diffusing from the bonding portion, the metal constituting the wires 31 and that constituting the pads 30 can form an eutectic in a satisfactory manner. This enables the connection strength between the wires 31 and the pads 30 to be increased.

Embodiment 5

Next, an Embodiment 5 of the invention will be described.

Figure 35:
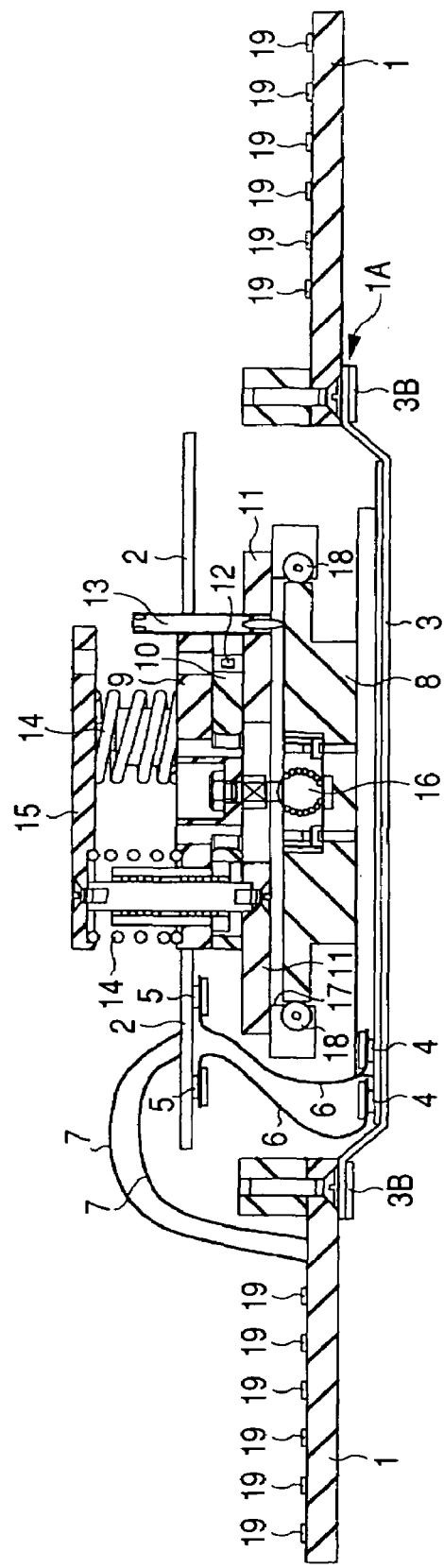
FIG. 35 is a section view of a representative part of a probe card, which represents Embodiment 5 of the invention.

While the transmission and reception of signals between the probes 20 and the multi-layered wiring board 1 are accomplished via the FPC cable 6 and the jump wires 7 in Embodiment 1, the transmission and reception of signals between some of the probes 20 and the multi-layered wiring board 1 in a probe card of this Embodiment 5 are accomplished in an outer circumferential area 1A of the thin film probe 3 adhered to the rear face of the multi-layered wiring board 1 by connecting the wires 21 (see FIG. 4) extending to that outer circumferential area 1A to connection terminals (sixth electrodes) disposed on the rear face of the multi-layered wiring board 1, and electrically connected to wiring (third circuit) in the multi-layered wiring board 1 as shown in FIG. 35. Since this connection of the wires 21 to the connection terminals disposed on the rear face of the multi-layered wiring board 1 serves to shorten the electrical distance from the probes 20 to the multi-layered wiring board 1, electrical characteristics, such as analog clocks, can be transmitted satisfactorily. In this Embodiment. 5, for example, probes 20 electrically connected to the wires 21 connected to the connection terminals disposed on the rear face of the multi-layered wiring board 1 can be used for the probing of the memory circuits (fifth circuits), the logic circuits (fifth circuits) and the like which are required to transmit electrical characteristics (second inspection signals) with high precision, while probes 20 electrically connected to the multi-layered wiring board 1 via the FPC cable 6 and the jump wires 7 can be used for the probing of power supply circuits (fourth circuits) including power supply wiring and ground wiring and the like.

While the invention accomplished by the present inventors has been described so far in specific terms with reference to preferred embodiments thereof, obviously the invention is not confined to these embodiments, but can be modified in various ways without deviating from its true spirit and scope.

The method of fabrication of semiconductor integrated circuit devices according to the invention can be extensively applied to probing steps in the fabrication process for semiconductor integrated circuit devices, for instance.

What is claimed is:

1. A fabrication method of semiconductor integrated circuit devices, comprising the steps of:
   (a) preparing a semiconductor wafer which is partitioned into a plurality of chip areas, a semiconductor integrated circuit being formed in each of said plurality of chip areas, and over whose main face a plurality of first electrodes electrically connected to said semiconductor integrated circuits are formed;
   (b) preparing a first card which holds a first sheet having a wiring electrically connected to a plurality of contact terminals for establishing contact with said plurality of first electrodes and said plurality of contact terminals so that tips of said plurality of contact terminals protrude toward the main face of said semiconductor wafer; and
   (c) electrically inspecting said semiconductor integrated circuits by bringing said plurality of contact terminals into contact with said plurality of first electrodes,
   wherein said tips of said plurality of contact terminals are arranged over a first face of said first sheet, and a plurality of second electrodes formed from part of said wiring are arranged over a second face of said first sheet, reverse to said first face,
   wherein said first card has a first substrate electrically connected to said plurality of second electrodes and suppressing mechanisms for suppressing said plurality of contact terminals toward said plurality of first electrodes,
   wherein said first substrate has a first circuit and over its main face a plurality of third electrodes electrically connected to said first circuit are formed,
   wherein said plurality of third electrodes are electrically connected to the respectively matching ones of said plurality of second electrodes via first wires,
   wherein the number of said first wires electrically connected between said second electrodes and said third electrodes through which relatively large currents flow is relatively greater than the number of said first wires electrically connected between said second electrodes and said third electrodes through which relatively small currents flow,
   wherein said suppressing mechanisms are arranged above said plurality of contact terminals over said second face of said first sheet, and
   wherein one of said suppressing mechanisms suppresses one or more of said contact terminals.

2. The fabrication method of semiconductor integrated circuit devices according to claim 1, wherein said first wires electrically connected between said second electrodes and said third electrodes through which relatively large currents flow are relatively thicker than said first wires electrically connected between said second electrodes and said third electrodes through which relatively small currents flow.

3. The fabrication method of semiconductor integrated circuit devices according to claim 1, wherein an electronic element electrically connected to said first circuit is mounted over a surface of said first substrate.

4. The fabrication method of semiconductor integrated circuit devices according to claim 3, wherein said electronic element constitutes a second circuit for performing said electrical inspection of said semiconductor integrated circuits.

5. The fabrication method of semiconductor integrated circuit devices according to claim 1, wherein said main face of said semiconductor wafer is divided into a plurality of first areas, each of said plurality of chip areas is arranged in one or another of said plurality of first areas, and said step (c) is performed on each of said plurality of first areas.

6. The fabrication method of semiconductor integrated circuit devices according to claim 1,
   wherein said suppressing mechanisms are arranged above said plurality of contact terminals over said second face of said first sheet, and
   wherein one of said suppressing mechanisms suppresses one of said contact terminals.

7. A fabrication method of semiconductor integrated circuit devices, comprising the steps of:
   (a) preparing a semiconductor wafer which is partitioned into a plurality of chip areas, a semiconductor integrated circuit being formed in each of said plurality of chip areas, and over whose main face a plurality of first electrodes electrically connected to said semiconductor integrated circuits are formed;
   (b) preparing a first card which holds a first sheet having a wiring electrically connected to a plurality of contact terminals for establishing contact with said plurality of first electrodes and said plurality of contact terminals so that tips of said plurality of contact terminals protrude toward the main face of said semiconductor wafer; and
   (c) electrically inspecting said semiconductor integrated circuits by bringing said plurality of contact terminals into contact with said plurality of first electrodes,
   wherein said tips of said plurality of contact terminals are arranged over a first face of said first sheet, and a plurality of second electrodes formed from part of said wiring are arranged over a second face of said first sheet, reverse to said first face,
   wherein said first card has a first substrate electrically connected to said plurality of second electrodes, a third substrate electrically connected to said wiring and said first substrate, and suppressing mechanisms for suppressing said plurality of contact terminals toward said plurality of first electrodes, wherein said first substrate has a first circuit and over its main face a plurality of third electrodes electrically connected to said first circuit and a plurality of fourth electrodes for introducing signals from outside said first substrate into said first substrate are formed, wherein said third substrate has a third circuit, and over its main face a plurality of fifth electrodes electrically connected to said plurality of fourth electrodes are formed, and over its rear face a plurality of sixth electrodes electrically connected to part of said wiring are formed, wherein said plurality of third electrodes are electrically connected to respectively matching ones of said plurality of second electrodes via first wires, wherein said plurality of sixth electrodes and part of said wiring are electrically connected to each other by adhering part of said second face of said first sheet to said rear face of said third substrate, wherein said suppressing mechanisms are arranged above said plurality of contact terminals over said second face of said first sheet, wherein one of said suppressing mechanisms suppresses one or more of said contact terminals, wherein said semiconductor integrated circuit comprises a fourth circuit and a fifth circuit, wherein, at said step (c), said plurality of contact terminals electrically connected to said plurality of third electrodes come into contact with said first electrodes electrically connected to said fourth circuit to transmit a first inspection signal to said fourth circuit, and wherein, at said step (c), said plurality of contact terminals electrically connected to said plurality of sixth electrodes come into contact with said first electrodes electrically connected to said fifth circuit to transmit a second inspection signal to said fifth circuit.

8. The fabrication method of semiconductor integrated circuit devices according to claim 7, wherein said main face of said semiconductor wafer is divided into a plurality of first areas, each of said plurality of chip areas is arranged in one or another of said plurality of first areas, and said step (c) is performed on each of said plurality of first areas.

9. The fabrication method of semiconductor integrated circuit devices according to claim 7, wherein said suppressing mechanisms are arranged above said plurality of contact terminals over said second face of said first sheet, and wherein one of said suppressing mechanisms suppresses one of said contact terminals.

10. The fabrication method of semiconductor integrated circuit devices according to claim 9, wherein said suppressing mechanisms are formed by superposing a first elastic material and a second elastic material one over the other successively from said first sheet side, and wherein said first elastic material and said second elastic material are so deformed by pressure applied when said plurality of contact terminals suppress said plurality of first electrodes as to absorb any gap between said tips of said plurality of contact terminals and said plurality of first electrodes.

11. The fabrication method of semiconductor integrated circuit devices according to claim 10, wherein said first elastic material eases any impact transmitted to said semiconductor wafer when said plurality of contact terminals come into contact with said plurality of first electrodes, and wherein said second elastic material absorbs any excessive load working on said plurality of contact terminals after said plurality of contact terminals and said plurality of first electrodes have come into contact with each other.

12. A fabrication method of semiconductor integrated circuit devices, comprising the steps of:

(a) preparing a semiconductor wafer which is partitioned into a plurality of chip areas, a semiconductor integrated circuit being formed in each of said plurality of chip areas, and over whose main face a plurality of first electrodes electrically connected to said semiconductor integrated circuits are formed;

(b) preparing a first card which holds a first sheet having a wiring electrically connected to a plurality of contact terminals for establishing contact with said plurality of first electrodes and said plurality of contact terminals so that tips of said plurality of contact terminals protrude toward the main face of said semiconductor wafer; and (c) electrically inspecting said semiconductor integrated circuits by bringing said plurality of contact terminals into contact with said plurality of first electrodes, wherein said tips of said plurality of contact terminals are arranged over a first face of said first sheet, and a plurality of second electrodes formed from part of said wiring are arranged over a second face of said first sheet, reverse to said first face, wherein said first card has a first substrate electrically connected to said plurality of second electrodes and suppressing mechanisms for suppressing said plurality of contact terminals toward said plurality of first electrodes, wherein said first substrate has a first circuit and over its main face a plurality of third electrodes electrically connected to said first circuit are formed, wherein said plurality of third electrodes are electrically connected to the respectively matching ones of said plurality of second electrodes via first wires, wherein said suppressing mechanisms are arranged above said plurality of contact terminals over said second face of said first sheet, wherein one of said suppressing mechanisms suppresses one or more of said contact terminals, wherein a relay electrically connected to said first circuit is mounted over a surface of said first substrate, wherein said first substrate has a fourth electrode for introducing signals from outside said first substrate into said first substrate and a plurality of said first circuits, wherein said first wires electrically connect said plurality of third electrodes and said plurality of second electrodes so as to electrically connect every one of said plurality of contact terminals to a matching one of said plurality of first circuits, and wherein said relay performs switching operation to electrically connect said fourth electrode to a selected one of said first circuits.

13. The fabrication method of semiconductor integrated circuit devices according to claim 12, wherein a plurality of types of said electrical inspection of said semiconductor integrated circuits are accomplished by said switching operation of said relay.

14. A fabrication method of semiconductor integrated circuit devices, comprising the steps of:

(a) preparing a semiconductor wafer which is partitioned into a plurality of chip areas, a semiconductor integrated circuit being formed in each of said plurality of chip areas, and over whose main face a plurality of first electrodes electrically connected to said semiconductor integrated circuits are formed;

(b) preparing a first card which holds a first sheet having a wiring electrically connected to a plurality of contact terminals for establishing contact with said plurality of first electrodes and said plurality of contact terminals so that tips of said plurality of contact terminals protrude toward the main face of said semiconductor wafer; and (c) electrically inspecting said semiconductor integrated circuits by bringing said plurality of contact terminals into contact with said plurality of first electrodes, wherein said tips of said plurality of contact terminals are arranged over a first face of said first sheet, and a plurality of second electrodes formed from part of said wiring are arranged over a second face of said first sheet, reverse to said first face, wherein said first card has a first substrate electrically connected to said plurality of second electrodes and suppressing mechanisms for suppressing said plurality of contact terminals toward said plurality of first electrodes, wherein said first substrate has a first circuit and over its main face a plurality of third electrodes electrically connected to said first circuit are formed, wherein said plurality of third electrodes are electrically connected to the respectively matching ones of said plurality of second electrodes via first wires, wherein said suppressing mechanisms are arranged above said plurality of contact terminals over said second face of said first sheet, wherein one of said suppressing mechanisms suppresses one or more of said contact terminals, wherein said suppressing mechanisms are arranged above said plurality of contact terminals over said second face of said first sheet, wherein one of said suppressing mechanisms suppresses one of said contact terminals, wherein said suppressing mechanisms are formed by superposing a first elastic material and a second elastic material one over the other successively from said first sheet side, and wherein said first elastic material and said second elastic material are so deformed by pressure applied when said plurality of contact terminals suppress said plurality of first electrodes as to absorb any gap between said tips of said plurality of contact terminals and said plurality of first electrodes.

15. The fabrication method of semiconductor integrated circuit devices according to claim 14, wherein said first elastic material eases any impact transmitted to said semiconductor wafer when said plurality of contact terminals come into contact with said plurality of first electrodes, and wherein said second elastic material absorbs any excessive load working on said plurality of contact terminals after said plurality of contact terminals and said plurality of first electrodes have come into contact with each other.

16. A fabrication method of semiconductor integrated circuit devices, comprising the steps of:

(a) preparing a semiconductor wafer which is partitioned into a plurality of chip areas, a semiconductor integrated circuit being formed in each of said plurality of chip areas, and over whose main face a plurality of first electrodes electrically connected to said semiconductor integrated circuits are formed;

(b) preparing a first card which holds a first sheet having a wiring electrically connected to a plurality of contact terminals for establishing contact with said plurality of first electrodes and said plurality of contact terminals so that tips of said plurality of contact terminals protrude toward the main face of said semiconductor wafer; and (c) electrically inspecting said semiconductor integrated circuits by bringing said plurality of contact terminals into contact with said plurality of first electrodes, wherein said tips of said plurality of contact terminals are arranged over a first face of said first sheet, and a plurality of second electrodes formed from part of said wiring are arranged over a second face of said first sheet, reverse to said first face, wherein said first card has a first substrate electrically connected to said plurality of second electrodes and suppressing mechanisms for suppressing said plurality of contact terminals toward said plurality of first electrodes, wherein said first substrate has a first circuit and over its main face a plurality of third electrodes electrically connected to said first circuit are formed, wherein said plurality of third electrodes are electrically connected to the respectively matching ones of said plurality of second electrodes via first wires, wherein said suppressing mechanisms are arranged above said plurality of contact terminals over said second face of said first sheet, wherein one of said suppressing mechanisms suppresses one or more of said contact terminals, and wherein said first sheet is formed by a process comprising the steps of:

(b1) preparing a crystalline second substrate;

(b2) forming a plurality of pyramidal or truncated pyramidal first holes by selectively and anisotropically etching said second substrate;

(b3) selectively forming over said plurality of first holes a plurality of first metal films, one film over each hole, in which said plurality of first holes are to be embedded;

(b4) forming a first polyimide film over said second substrate and said first metal film;

(b5) forming a plurality of first opening reaching said plurality of first metal films by selectively etching said first polyimide film;

(b6) forming a second metal film in which said plurality of first openings are to be embedded over said first polyimide film, and forming a plurality of said wirings for electrical connection to said plurality of first metal films by patterning said second metal film;

(b7) forming a second polyimide film over a plurality of said wirings and said first polyimide film;

(b8) adhering a rigid second sheet onto said first substrate, forming a second opening in said second sheet over said first metal film, and forming a third opening in said second sheet over those first areas in which said first metal film is not formed over said first substrate;

(b9) forming said plurality of second electrodes by removing said second polyimide film underneath said third opening and exposing said wiring underneath said third opening;

(b10) forming in said second opening first elastic material into which said second opening is to be embedded in a state in which said second sheet is adhered to said first substrate, and forming a second elastic material over said first elastic material;

(b11) preparing said first substrate in which a fourth opening matching said third opening is formed, and adhering a rear face of said first substrate to said second elastic material with a position of said third opening and a position of said fourth opening being aligned with each other;

(b12) electrically connecting said plurality of third electrodes to the respectively matching ones of said plurality of second electrodes by said first wires; and (b13) removing said first substrate and forming said plurality of contact terminals from said plurality of first metal films, wherein said semiconductor wafer and said second sheet have a first linear expansion ratio.

17. The fabrication method of semiconductor integrated circuit devices according to claim 16, wherein a main constituent of said semiconductor wafer is silicon, and a main constituent of said second sheet is 42 Alloy or ceramic.

* * * * *